United States Patent
Englehart et al.

(10) Patent No.: US 8,762,311 B1
(45) Date of Patent: *Jun. 24, 2014

(54) PROVING LATENCY ASSOCIATED WITH REFERENCES TO A DATA STORE

(71) Applicant: The MathWorks, Inc., Natick, MA (US)

(72) Inventors: Matthew Englehart, Olmstead Township, OH (US); Peiter J. Mosterman, Framingham, MA (US)

(73) Assignee: The MathWorks, Inc., Natick, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/632,509

(22) Filed: Oct. 1, 2012

Related U.S. Application Data

(63) Continuation of application No. 12/404,118, filed on Mar. 13, 2009, now Pat. No. 8,280,832.

(60) Provisional application No. 61/157,470, filed on Mar. 4, 2009.

(51) Int. Cl.
*G06F 17/00* (2006.01)

(52) U.S. Cl.
USPC .............................................. 706/45; 706/48

(58) Field of Classification Search
None
See application file for complete search history.

(56) References Cited

U.S. PATENT DOCUMENTS

| | | | |
|---|---|---|---|
| 5,283,896 A | 2/1994 | Temmyo et al. | |
| 6,457,173 B1 | 9/2002 | Gupta et al. | |
| 6,470,486 B1 | 10/2002 | Knapp | |
| 6,857,082 B1 | 2/2005 | Josan et al. | |
| 7,149,959 B1 * | 12/2006 | Jones et al. | 715/234 |
| 7,555,418 B1 | 6/2009 | Qadeer et al. | |
| 8,234,647 B1 | 7/2012 | Chutinan et al. | |
| 8,280,832 B1 | 10/2012 | Englehart et al. | |
| 2002/0004810 A1 | 1/2002 | Reneris | |
| 2002/0095434 A1 | 7/2002 | Lane | |
| 2004/0078618 A1 | 4/2004 | Moser et al. | |
| 2004/0181543 A1 | 9/2004 | Wu et al. | |
| 2005/0060647 A1 | 3/2005 | Doan et al. | |
| 2005/0125789 A1 | 6/2005 | Dijkstra et al. | |
| 2009/0144545 A1 | 6/2009 | Dhuvur et al. | |

OTHER PUBLICATIONS

Co-pending U.S. Appl. No. 13/826,812 entitled "Determining Conditions Associated with Accessing Data Stores", by Engleheart et al., filed Mar. 14, 2013, 72 pages.
Co-pending U.S. Appl. No. 12/404,085 entitled "Checking for Access Problems with Data Stores", by Han, filed Mar. 13, 2009, 75 pages.
Xie et al., Allocation and Scheduling of Conditional Task Graph in Hardware/Software Co-Synthesis, Proceedings of the Conference on Design, Automation and Test in Europe, Mar. 2001, pp. 620-625.
Co-pending U.S. Appl. No. 12/404,118, filed Mar. 13, 2009 entitled "Proving Latency Associated With References to a Data Store" by Matthew Englehart et al., 76 pages.

* cited by examiner

*Primary Examiner* — Jeffrey A Gaffin
*Assistant Examiner* — Paulinho E Smith
(74) *Attorney, Agent, or Firm* — Harrity & Harrity, LLP

(57) ABSTRACT

In an embodiment, a technique for analyzing a model, either statically or dynamically, to check the model for one or more specified patterns with respect to accessing a data store associated with the model. The patterns may include, for example, writing to a data store prior to reading the data store, reading the data store prior to writing the data store, writing to the data store multiple times prior to reading the data store, reading the data store multiple times before writing the data store, etc. The model may be an executable graphical model that is generated in a graphical modeling environment. A result may be generated based on the analyzing. The result may be output.

20 Claims, 25 Drawing Sheets

500

| PARAMETERS | |
|---|---|
| ID | VALUE |
| STORAGE_CLASS | GLOBAL |
| STORAGE_TYPE | INTEGER |
| MAX_VALUE | 4294967295 |
| MIN_VALUE | 0 |
| WRITE_COUNT | 1 |
| RESET_VALUE | 0 |
| READ_CONDITION | WRITE_COUNT > 1 |
| WRITE_CONDITION | WRITE_COUNT = RESET_VALUE |

530a — WRITE_COUNT
530b — RESET_VALUE
530c — READ_CONDITION
530d — WRITE_CONDITION
530

FIG. 5

PROVING LATENCY ASSOCIATED WITH REFERENCES TO A DATA STORE

RELATED APPLICATIONS

The present application is a continuation of U.S. patent application Ser. No. 12/404,118, filed Mar. 13, 2009, which claims the benefit of U.S. Provisional Application No. 61/157,470, filed on Mar. 4, 2009, the disclosures of which are incorporated by reference herein in their entirety.

BACKGROUND

Modeling environments (MEs) may present a user, such as a scientist or engineer, with an environment that enables analysis and generation of technical applications. For example, using certain MEs, users may perform analyses, visualize data, and develop algorithms. MEs may allow a technical researcher or designer to quickly perform tasks, such as research and product development.

Many existing MEs may be implemented as or run in conjunction with a graphically-based environment. For example, in one existing graphically-based ME, a modeling tool allows models to be built by connecting graphical blocks, where a graphical block may represent an object associated with functionality and/or data.

Blocks may be hierarchical in the sense that a block itself may contain one or more blocks (sub-blocks) that make up the block. A user may, for instance, view a model at a high level, then select blocks to drill down into the model to see increasing levels of model detail. A subsystem block may be a type of block that may contain one or more blocks that constitute a hierarchical layer in a graphical model structure.

Models may be automatically converted to computer code by an ME. The code can be executed, e.g., by a target device in a target environment, the ME, etc. For example, a model of a control system for an antilock braking system may be graphically developed with the graphical modeling tool, implemented as code, and then deployed on a target device (e.g., a dedicated computer) tasked with controlling the antilock braking system. The target device may itself be connected to one or more sensors or other computers on the antilock braking system.

BRIEF DESCRIPTION OF THE DRAWINGS

The accompanying drawings, which are incorporated in and constitute a part of this specification, illustrate one or more embodiments of the invention and, together with the description below, explain the invention. In the drawings.

FIG. 5 illustrates an example of a graphical user interface (GUI) that may be used to display and/or set parameter information associated with a block in a model;

DESCRIPTION

Figure 1:
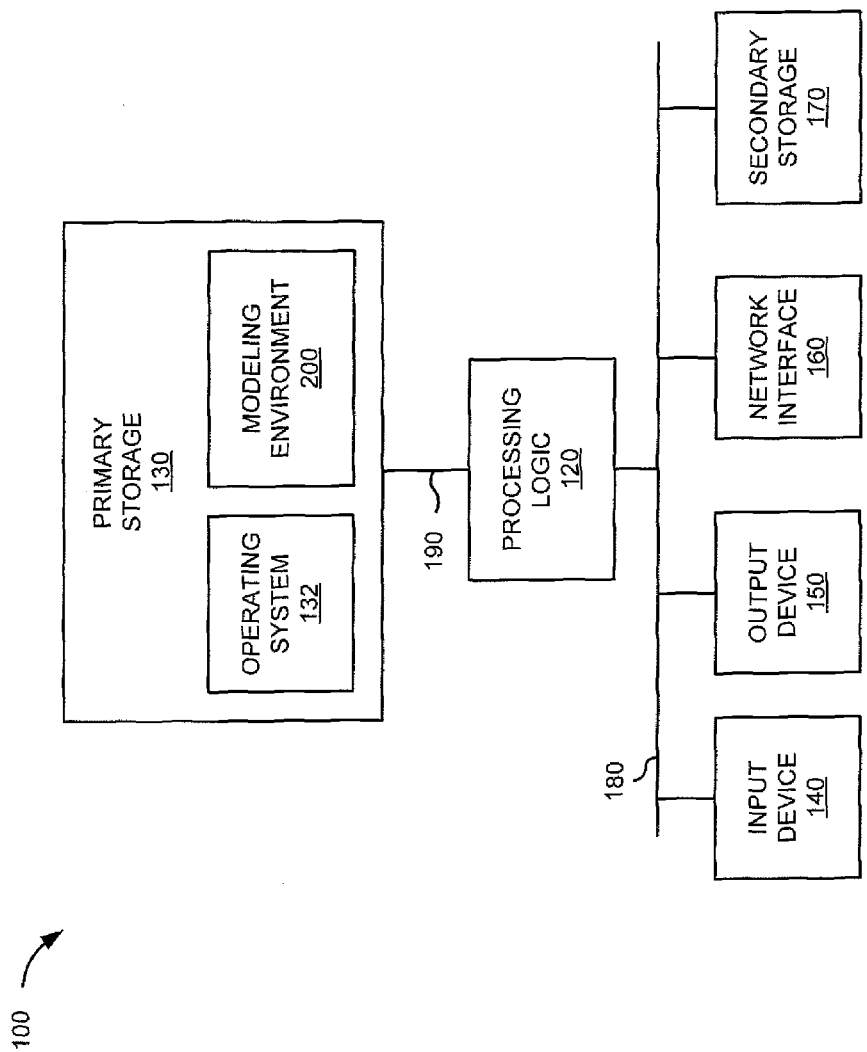
FIG. 1 illustrates an example of a computer system that may be configured to practice one or more embodiments of the invention.

FIG. 1 illustrates an example of a computer system 100 that may be used to practice one or more embodiments of the invention. Referring to FIG. 1, the computer system 100 may include processing logic 120, a primary storage 130, an input device 140, an output device 150, a network interface 160, a secondary storage 170, an input/output (I/O) bus 180, and a primary storage bus 190. It should be noted that computer system 100 is one example of a computer system that may be configured to practice one or more embodiments of the invention. Other computer systems that are more complex or less complex than computer system 100 may be configured to practice one or more embodiments of the invention.

The I/O bus 180 may be an interconnect bus configured to make the input device 140, output device 150, network interface 160, and secondary storage 170 accessible to the processing logic 120 and enable information (e.g., data) to be transferred between the processing logic 120, input device 140, output device 150, network interface 160, and secondary storage 170. Similarly, the primary storage bus 190 may be an interconnect bus configured to make the primary storage 130 accessible to the processing logic 120 and enable information to be transferred between the processing logic 120 and the primary storage 130.

The processing logic 120 may comprise one or more central processing units (CPUs) that include logic configured to execute computer-executable instructions and manipulate data contained in the primary storage 130. The instructions and data may be associated with software contained in the primary storage 130, such as an operating system (OS) 132 and a modeling environment (ME) 200. The processing logic 120 may comprise a single core or multiple cores, where a core may be configured to implement a CPU. The processing logic 120 may comprise a variety of heterogeneous hardware. The hardware may include, for example, some combination of one or more processors (e.g., microprocessors), systems-on-a-chip (SoCs), field programmable gate arrays (FPGAs), application specific instruction set processors (ASIPs), graphics processing units, application specific integrated circuits (ASICs), digital signal processors (DSPs), programmable logic devices (PLDs), micromechanical systems (MEMS), complex programmable logic devices (CPLDs), etc. An example of a processor that may be used to implement processing logic 120 is the Intel® Xeon® processor available from Intel Corporation, Santa Clara, Calif. Note that one or more embodiments of the invention may be implemented across multiple computer systems.

The input device 140 may include logic configured to input information into system 100 from, e.g., a user. Embodiments of the input device 140 may include, for example, keyboards, multi-point input devices, touch sensitive displays, biometric sensing devices, computer mice, trackballs, accelerometers, gyroscopes, cameras, microphones, pen-based pointing devices, etc.

The output device 150 may comprise logic configured to output information from system 100. Embodiments of the output device 150 may include cathode ray tubes (CRTs), plasma displays, light-emitting diode (LED) displays, liquid crystal displays (LCDs), printers, vacuum florescent displays (VFDs), haptic devices, tactile devices, etc.

The network interface 160 may comprise logic configured to interface the computer system 100 with a network (e.g., a data network) and enable the computer system 100 to exchange information with other entities connected to the network. An example of a network that may be used with network interface 160 will be described further below with respect to FIG. 12. Network interface 160 may include a built-in network adapter, network interface card (NIC), Personal Computer Memory Card International Association (PCMCIA) network card, card bus network adapter, wireless network adapter, Universal Serial Bus (USB) network adapter, modem, or other device suitable for interfacing computer system 100 to a network.

The secondary storage 170 may include logic configured to store and retrieve data and/or computer-executable instructions (code) on a computer-readable medium, which may be part of the secondary storage 170. The data and/or computer-executable instructions may be used (e.g., executed) by computer system 100 and may include data and/or computer-executable instructions configured to implement one or more embodiments of the invention.

The medium may include magnetic storage (e.g., hard disk, floppy disk, etc.), optical storage (e.g., CD-ROM, DVD, etc.), semiconductor storage (e.g., flash memory, dynamic random access memory (DRAM), static random access memory (SRAM), etc.) and so forth. Examples of secondary storage 170 may include hard drives, floppy drives, flash drives, etc.

The primary storage 130 may comprise logic configured to implement a primary storage for the computer system 100. The primary storage 130 may be directly accessible to the processing logic 120 via the primary storage bus 190. The primary storage 130 may be organized as a random access memory (RAM) and may be implemented using some combination of volatile and non-volatile RAM devices. These devices may include DRAM devices, flash memory devices, SRAM devices, content addressable memory (CAM) devices, etc.

The primary storage 130 may store the OS 132 and the ME 200. The OS 132 may be a conventional operating system that is configured to implement various conventional operating system functions, such as scheduling software to run on the processing logic 120, managing the primary storage 130, and controlling access to various entities in the system 100 (e.g., the input device 140, the output device 150, the network interface 160, and the secondary storage 170). Examples of an operating system that may be used include the Linux operating system, Microsoft® Windows® operating system, a mobile device operating system, the Symbian operating system, the Android operating system, etc. A version of the Linux operating system that may be used is the Red Hat Linux operating system available from Red Hat Corporation, Raleigh, N.C. A version of the Microsoft® Windows® operating system that may be used is the Microsoft® Windows Vista™ operating system available from Microsoft Inc., Redmond, Wash.

The ME 200 may be configured to implement a modeling environment that may be used to, inter alia, build, analyze, interpret, and execute models. ME 200 may be a graphical modeling environment that enables graphical models to be built, analyzed, interpreted, and/or executed. Moreover, ME 200 may support automatic code generation. For example, ME 200 may automatically generate code for a model where the generated code may be compiled to produce an executable version of the model. ME 200 may include graphical capabilities/features, textual capabilities/features, or some hybrid that includes both textual and graphical capabilities/features. The ME 200 may contain computer-executable instructions and data that are configured to implement some or all of the functionality provided by the ME 200.

An example of an ME that may be used with embodiments of the invention is Simulink®, which is available from The MathWorks, Inc., Natick, Mass. Other MEs that may be used with embodiments of the invention may include but are not limited to Stateflow®, and SimEvents®, which are available from The MathWorks, Inc.; Unified Modeling Language (UML); profiles associated with UML (e.g., Modeling Analysis and Real-Time Embedded Systems (MARTE), Systems Modeling Language (SysML), Avionics Architecture Description Language (AADL), etc.); GNU Octave from the GNU Project; MATRIXx and LabView® from National Instruments; Mathematica from Wolfram Research, Inc.; Mathcad from Mathsoft Engineering & Education Inc.; Maple from Maplesoft; Extend from Imagine That, Inc.; Scilab and Scicos from The French Institution for Research in Computer Science and Control (INRIA); Modelica or Dymola from Dynasim AB; VisSim from Visual Solutions; SoftWIRE from Measurement Computing Corporation; WiT from DALSA Coreco; VEE Pro and SystemVue from Agilent Technologies, Inc.; Vision Program Manager from PPT Vision, Inc.; Khoros from Khoral Research, Inc.; VisiQuest from Pegasus Imaging Corporation, Gedae from Gedae, Inc.; Virtuoso from Cadence Design Systems, Inc.; Rational Rose, Rhapsody and Tau from International Business Machines (IBM), Inc.; SCADE from Esterel Technologies; and Ptolemy from the University of California at Berkeley.

ME 200 may include hardware and/or software configured to provide a computing environment that allows a user to perform tasks related to disciplines, such as, but not limited to, mathematics, science, engineering, medicine, business, and so on. The ME 200 may include a programming language that (1) supports dynamically-typed data and (2) can be used to express problems and/or solutions in mathematical notations (e.g., the MATLAB® M-language). For example, the ME 200 may use an array as a basic element, where the array may not require dimensioning. These arrays may be used to support array-based programming where an operation can apply to an entire set of values included in the arrays. Array-based programming may allow array-based operations to be treated as a high-level programming technique and may let a user think and operate on whole aggregations of data without having to resort to explicit loops of individual non-array operations.

In addition, the ME 200 may be adapted to perform matrix and/or vector formulations that may be used for data analysis, data visualization, application development, simulation, modeling, data acquisition, and/or algorithm development. These matrix and/or vector formulations may be used in many areas, such as statistics, image processing, signal processing, control design, life sciences modeling, discrete event analysis and/or design, state-based analysis and/or design, and so on.

The ME 200 may further provide mathematical functions and/or graphical tools that may be used, for example, to create plots, surfaces, images, volumetric representations, etc. The ME 200 may provide these functions and/or tools via toolboxes (e.g., toolboxes for signal processing, image processing, data plotting, and/or parallel processing). In addition, the ME 200 may provide these functions via a library, remote database, etc. ME 200 may also be configured to support fixed-point.

Figure 2:
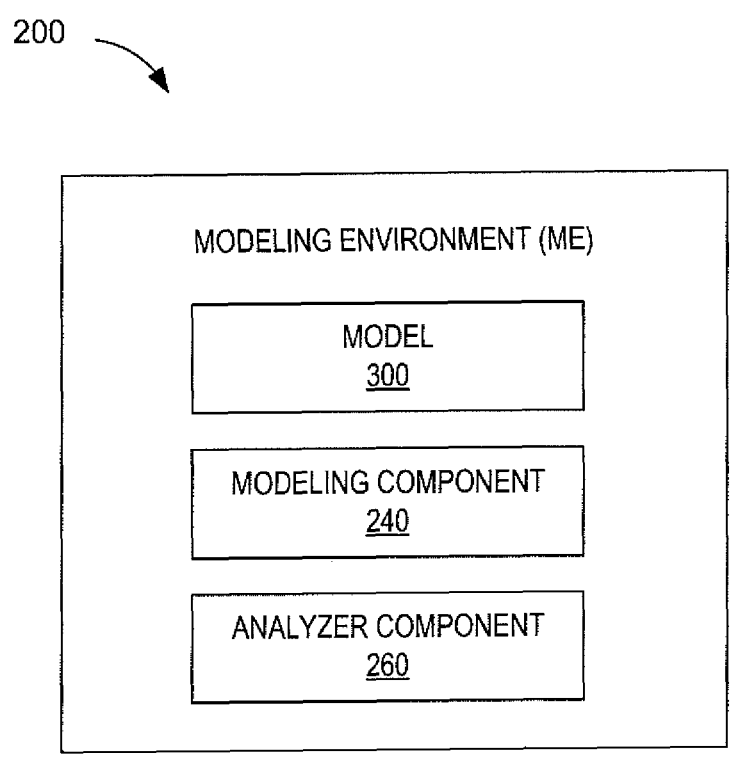
FIG. 2 illustrates an example of a modeling environment (ME) that may be configured to practice one or more embodiments of the invention.

FIG. 2 illustrates an embodiment of ME 200. Referring to FIG. 2, the ME 200 may include a model 300, a modeling component 240, and an analyzer component 260. Portions of the ME 200 may be implemented using various computer-executable instructions that may be executed by processing logic 120. In addition, portions of ME 200 may include data that may be generated, manipulated, and/or otherwise processed by the processing logic 120.

The model 300 may be configured to model a dynamic system. A dynamic system (either natural or man-made) may be a system whose response at any given time may be a function of its input stimuli, its current state, and a current time. A dynamic system may be a physical system and may range from being a simple system to being a highly complex system. Natural dynamic systems may include, for example, a falling body, the rotation of the earth, bio-mechanical systems (muscles, joints, etc.), bio-chemical systems (gene expression, protein pathways), weather and climate pattern systems, etc. Examples of man-made or engineered dynamic systems may include, for example, a bouncing ball, a spring with a mass tied on an end, automobiles, airplanes, control systems in major appliances, communication networks, audio signal processing, mobile phones, nuclear reactors, a stock market, etc.

A dynamic system may be modeled by the model 300 in the ME 200 as a set of differential, difference, and/or algebraic equations. At a given instant of time, these equations may be viewed as relationships between the system's output response ("outputs"), the system's input stimuli ("inputs") at that time, the current state of the system, the system parameters, and time. The state of the system may be thought of as a numerical representation of a dynamically changing configuration of the system.

Model 300 may be a model of a dynamic system that has associated execution semantics that may be represented graphically as a collection of modeling elements, often referred to as blocks. The model 300 may be executable. Note that one or more embodiments of the invention may be performed using a full model or a partial model. The blocks may be interconnected by graphical lines that may represent signals. A block may represent an elemental dynamic system that may be part of the model 300. The block may be associated with a series of one or more system equations that represent a behavior of the elemental dynamic system. Note that the term "block", as used herein, is not limited to referring to a modeling element that represents an elemental dynamic system but may also include other modeling elements, such as modeling elements that may aid in a readability and modularity of block diagrams.

Blocks in a block diagram may be virtual or non-virtual. A non-virtual block may influence equations used to model a dynamic system. Virtual blocks, on the other hand, typically do not affect the equations used to model the dynamic system. In other words, virtual blocks often wield no semantic influence on the model from a mathematical perspective. Rather, virtual blocks may be used to help improve the readability and structuring of a block diagram of a model. Examples of virtual blocks may include Simulink® virtual sub-systems, input port (import) blocks, output port (outport) blocks, bus creator blocks, "from" blocks, and "goto" blocks.

A signal may represent an input and/or an output of an elemental dynamic system represented by a block. Signals may correspond to time-varying quantities represented by a line connection to or from the block and may have values at various time instants during a simulation of the model 300. A source block of a signal may write to the signal at a given time instant when the source block's system equations are evaluated. A destination block of the signal may read the signal when the destination block's system equations are being evaluated.

The model 300 may include time-based relationships between signals and various state variables representative of the dynamic system modeled by the model 300. A solution (e.g., computation of system response) of the model 300 may be obtained by evaluating these relationships over time, where the time may start at a predetermined "start time" and end at a predetermined "stop time", or the evaluating may proceed indefinitely. Evaluation may potentially be interrupted or terminated by, for example, user interaction. For a class of systems, an evaluation of the relationships may be referred to as a time-step of execution of the model 300. The time-step of execution may be a logical time-step of execution or a physical time-step of execution. A logical time-step of execution may be a time-step of execution that occurs at a particular point in time. Here, evaluation of all blocks in a model may occur at the same time. A physical time-step of execution may be a time-step of execution that involves a duration of time. Here, blocks in the model may be evaluated at different times within the duration of time. Signals may represent quantities that change over time, and these quantities may be defined for various points in time of the block diagram's evaluations. Relationships between signals and state variables may be defined by sets of equations associated with blocks that make up the model 300. These equations may define a relationship between the input signals, output signals, state, and time. The blocks may also be associated with parameters, which may be coefficients of the equations.

It should be noted that model 300 may not only be used to represent time-based dynamic systems but also may be used for other models of computation. For example, a model 300 may be used to represent a flowchart that may be used to capture a process flow. Model 300 may also be used to describe a programming paradigm (e.g., a data flow paradigm) where an availability of data (often thought of as tokens) may be used to initiate an execution of blocks. Here, a block may represent an operation and a line may represent an execution dependency describing a direction of data flowing between blocks.

If a model, such as model 300, includes functionality provided in a declarative style, an imperative representation may have to be derived to allow execution. There may be a plurality of imperative representations of the same declarative functionality. Some of these representations may have different characteristics than others. For example, if the output of one functionality is declared to be input of a second functionality, than an imperative representation may evaluate the first functionality first and the second functionality next to obtain a solution. Alternatively, the second functionality may be evaluated first, the first functionality next, and the second functionality after that. In the latter case, the second functionality is evaluated twice and so this imperative representation may consume more execution resources. In general, the input/ output relations in a declarative style may be translated into constraints that help determine an imperative representation.

The modeling component 240 may contain computer-executable instructions and data that are configured to perform various tasks including (1) constructing model 300, for example, through a graphical user interface (GUI); (2) augmenting of a pre-defined set of blocks with custom user-specified blocks that may be associated with model 300; (3) using the model 300 to compute and trace a temporal evolution of outputs associated with a dynamic system represented by the model 300; and (4) automatically producing, for example, deployable software systems, descriptions of hardware systems, etc. that mimic a behavior of either the entire model 300 or portions of the model 300. The blocks may be represented in a graphical representation (e.g., a block diagram) of the model that may be presented (e.g., displayed, printed, etc.) by the ME 200 to, for example, a user.

The modeling component 240 may include a block diagram editor and an execution engine. The block diagram editor may be configured to allow, for example, a user, to specify, edit, annotate, save, print, publish, etc. a block diagram of model 300 comprising one or more blocks.

The execution engine may be configured to enable a computation and tracing of a dynamic system's outputs from the model 300. The execution engine may carry out the task of compiling and linking the block diagram to produce an "in-memory executable" version of the model 300 that is used for generating code and/or simulating verifying, trimming, or linearizing the model 300. Note that execution may include simulation.

Compiling may involve checking an integrity and validity of block interconnections in the block diagram. At this stage, the execution engine may also sort the blocks in the block diagram into hierarchical lists that may be used when creating block method execution lists. Linking may involve using a result of the compiled stage to allocate memory needed for an execution of the various components of the model 300. Linking may also produce block method execution lists that are used, for example, by a simulation or linearization of the model 300. Included within the link stage may be an initialization of the model 300 which may include evaluating one or more "setup" methods (e.g. block start, initialize, enable, and constant output methods). The block method execution lists may be generated because the simulation and/or linearization of the model 300 may execute block methods by type (not by block) when they have a sample hit.

Compilation may help obtain an imperative representation of a declarative style model. The sorting of the blocks may incorporate input/output relations as constraints to obtain a (potentially hierarchical) list. The list may be used to obtain an order in which the blocks or the methods that comprise the functionality of the blocks (such as computing the block output, computing the block state, modifying the block state, etc.) are evaluated during execution.

Other information that may be used to obtain the order of block or block method execution may be the rate with which a block executes. For example, if the output of a block is input of a block that executes at a rate half as fast as the block whose input it reads, then a rate-monotonic schedule may execute the fast block before the slow block. When both blocks execute, the fast block may compute its output and the slow block may start computing its output during which it reads the output of the fast block. If the fast block and the slow block are executed concurrently (e.g., in separate threads), the fast block may start its next computation while the slow block may still be computing. In this case, the fast block may produce new output when the previous output may not have been read partially or completely by the slow block. To avoid a potential non-determinism and/or data integrity violation and to handle pre-emption in general, the output of the fast task may be kept unchanged till the slow block completes is computations. The update of the output then is ordered and assigned a task based on the input/output relations as well as the execution rates of the connected blocks.

The analyzer component 260 may include computer-executable instructions that are configured to implement various acts that may allow model 300 to be analyzed on computer system 100 in accordance with one or more embodiments of the invention. Examples of these acts will be described further below with respect to FIGS. 8, 9A-B, 10A-C, and 11. An example of an analyzer component that may be adapted to include one or more embodiments of the invention includes the Simulink® Design Verifier™, which is available from The MathWorks, Inc.

Analyzing model 300 may include, inter alia, identifying one or more specified execution patterns that involve accessing a data store associated with the model 300. The patterns may be specified by a user, database, etc. and may include anomalous, undesirable, and/or desirable patterns. The patterns may include, for example, whether the data store is read before the data store is written, whether the data store is written before it is read, written multiple times before it is read, read multiple times before it is written, etc. The data store may correspond to anything that can hold data in a computing device. For example, a data store can be a datum, data that is passed between functions in a model, a database, a repository, a stack, a heap, a location in a memory, a register, a queue, etc. Data held by the data store may be encrypted, compressed, etc. Moreover, the data store may be non-volatile, volatile, etc. Data may be 'multiword' and each of the words may be independently read and written.

Figure 3A:
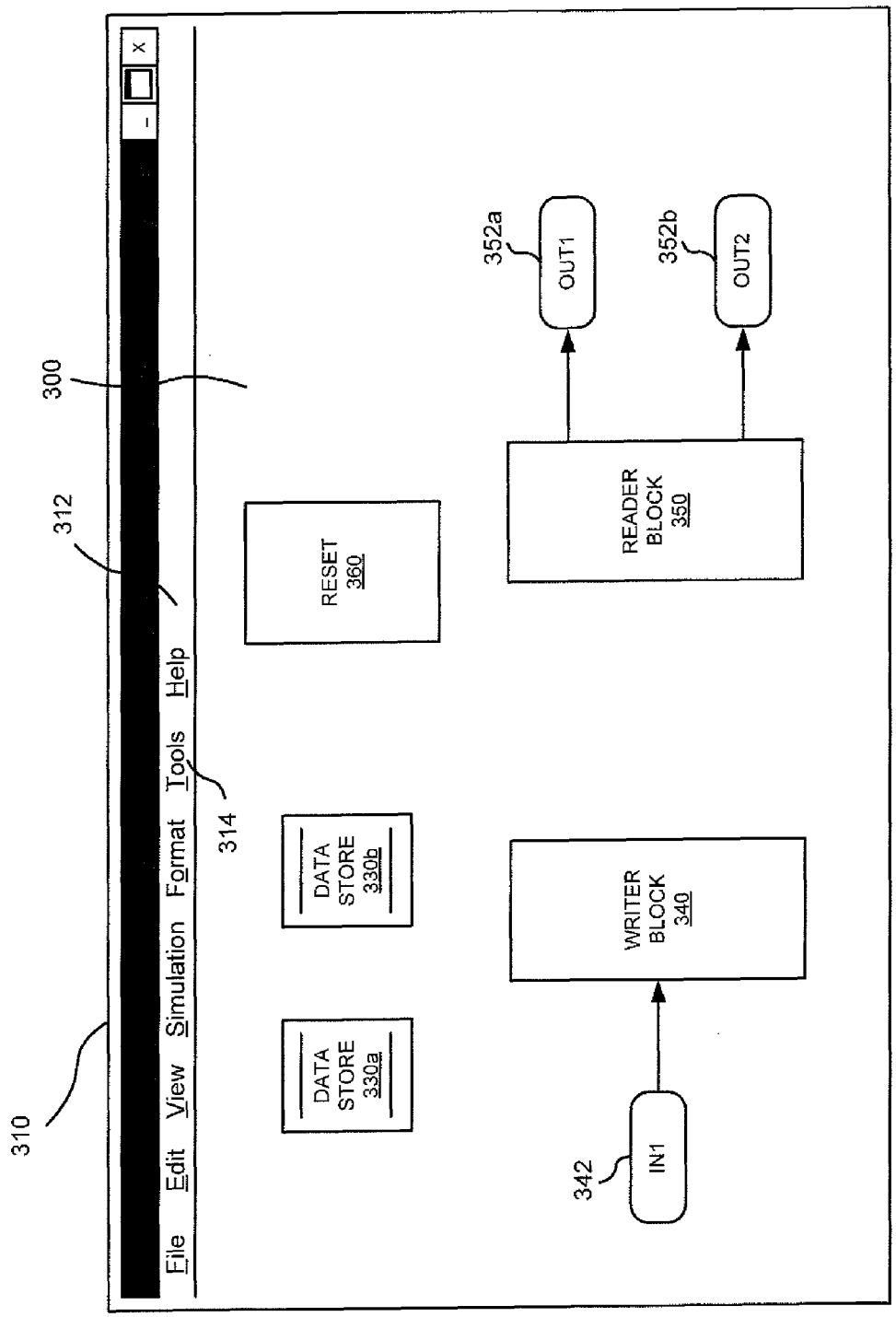
FIGS. 3A-D illustrate a block diagram of an example of a model that may read and write to a data store associated with the model.

FIGS. 3A-D illustrate block diagrams of an embodiment of model 300. The block diagram 320 may be generated, analyzed, and displayed by ME 200. Referring to FIG. 3A, the block diagram 320 comprises data store blocks 330*a-b*, reset block 360, import block 342, writer block 340, reader block 350, and outport blocks 352*a-b*.

A user may interact with the block diagram through a graphical window 310, which may be provided by the ME 200. Graphical window 310 may provide an interface through which commands relating to the block diagram model may be entered. For example, graphical window 310 may include a menu bar 312 that may allow the user to select various menus. The menus may contain menu selections that when selected perform various commands. For example, menu bar 312 contains a "tools" menu 314 which may include a menu selection (not shown) that when selected may, for example, display parameter information associated with a block in the block diagram 320 or analyze model 300 to identify one or more patterns with respect to accessing data stores 330*a-b*. It should be noted that other techniques may be used to enter commands relating to the block diagram 320. For example, a command line interface may be provided that enables commands relating to the block diagram to be entered.

The data store blocks 330*a-b* may be used to represent data stores in model 300. An example of a data store that may be used to implement a data store block in model 300 is a data store memory that is available in Simulink®. As will be described further below, data store 330*a* may be configured to hold a value that is written by writer block 340 and read by reader block 350. Data store 330*b* is an auxiliary data store that may be used to indicate whether data store 330*a* is written one or more times within a time-step of execution or other evaluation of the model 300. As will be described further below, other entities (e.g., a parameter) may be used to indicate whether data store 330a is written one or more times within a time-step of execution or other evaluation of the model 300.

Reset block 360 may be configured to reset the contents of data store 330b at a time-step of execution or other evaluation of the model 300. The contents may be reset to a predetermined value (e.g., zero).

Import block IN1 342 is a virtual block that is associated with writer block 340. Writer block 340 may be configured to write data store 330a with a value. In addition, as will be described further below, writer block 340 may write a value to data store 330b to indicate that data store 330a is written one or more times in a time-step of execution or other evaluation of model 300.

Reader block 350 may be configured to read data store 330a and output a value read from the data store 330a at outport 352a. In addition, as will be described further below, reader block 350 may be configured to read data store 330b to identify whether data store 330a is written one or more times prior to reading data store 330a. Outport block OUT1 352a and outport block OUT2 352b are virtual blocks that are associated with reader block 350.

Note that blocks 330b and 360 and/or functions performed by blocks 330b and 360 may be automatically generated by ME 200 in response to data store 330a. These blocks 330b and 360 and/or functions performed by these blocks 330b and 360 may be generated (e.g., as code) during a compilation of model 300. The blocks 330b, 360 may or may not be visible when the block diagram 320 is presented (e.g., displayed, printed, etc). Moreover, functionality provided by blocks 330b and 360 may be implemented as part of the writer 340 and reader 350 blocks. For example, as will be described further below, functionality provided by blocks 330b and 360 may be implemented as parameters associated with the writer 340 and reader 350 blocks, respectively.

Figure 3B:
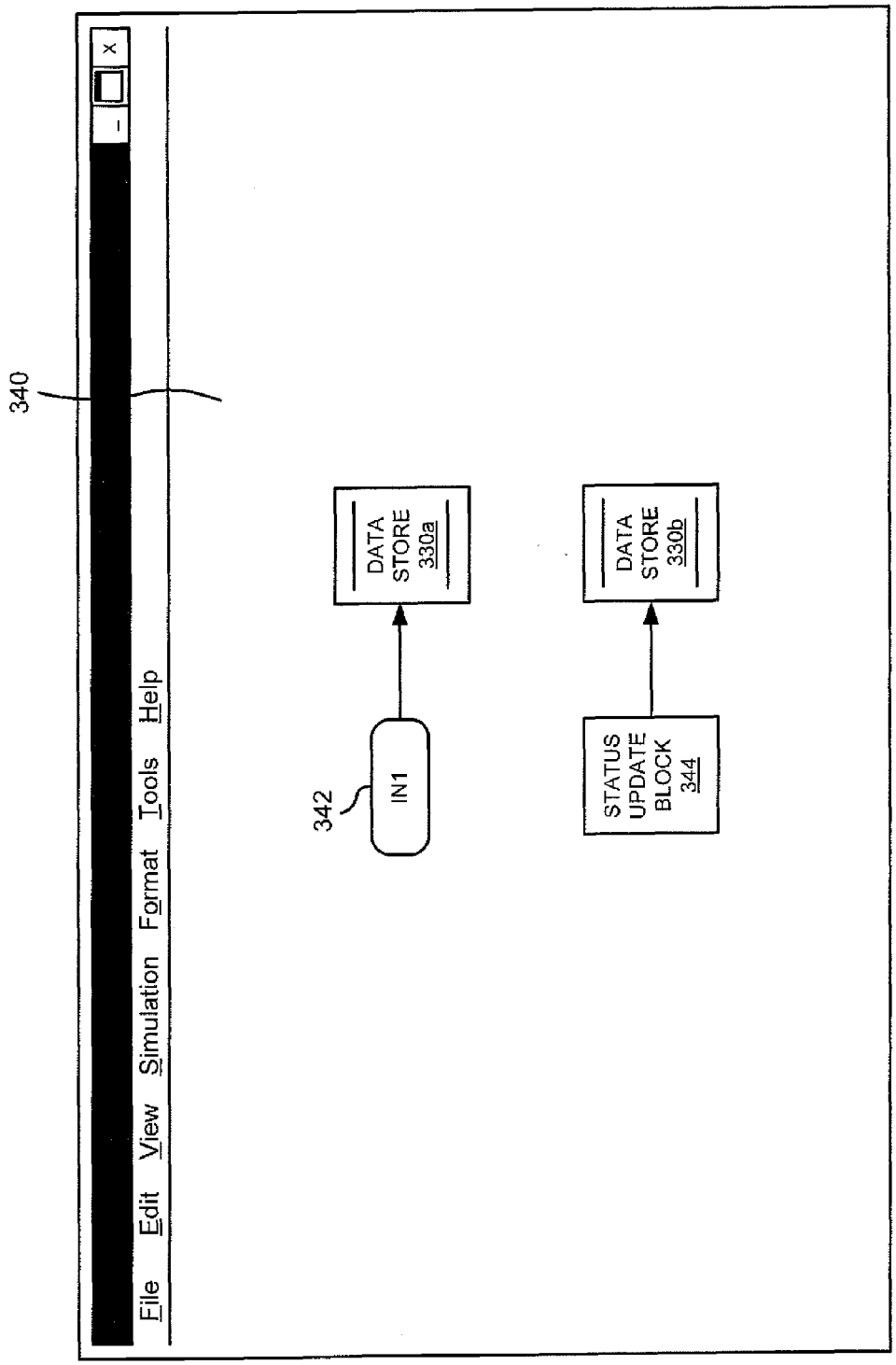

FIG. 3B illustrates writer block 340 in more detail. Referring to FIG. 3B, writer block 340 is configured to receive a value at import block IN1 342, and write the value to data store 330a. In addition, writer block 340 comprises a status update block 344 that writes a value to data store 330b. This value may indicate whether data store 330a is written by writer block 340 within a time-step of execution or other evaluation of model 300 and/or may indicate a number of times data store 330a has been written by writer block 340 within the time-step or other evaluation of model 300. For example, status update block 344 may be configured to write a value of "1" or a Boolean TRUE to data store 330b to indicate data store 330b is written by writer block 340 within the time-step or other evaluation. Likewise, for example, status update block 344 may be configured to update (e.g., increment) a value stored in data store 330b to indicate a number of times data store 330a is written by writer block 340 within the time-step or other evaluation.

Figure 3C:
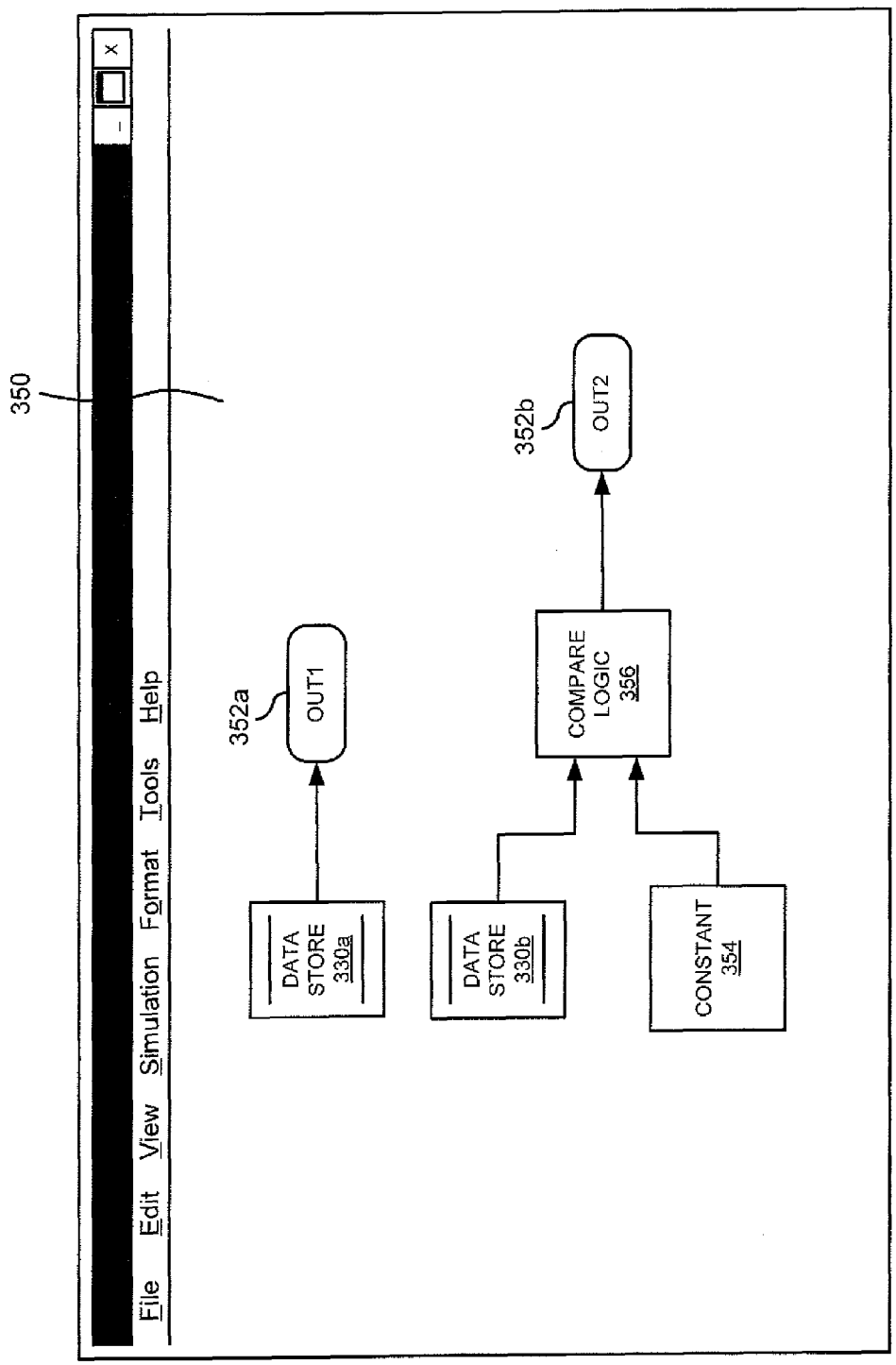

FIG. 3C illustrates reader block 350 in more detail. Referring to FIG. 3C, reader block 350 is configured to output a value stored in data store 330a via an outport OUT1 352a. Reader block 350 further comprises a constant generator 354 and compare logic 356. Constant generator 354 generates a value that is input into the compare logic 356 which compares the received value with the value stored in data store 330b. Compare logic 356 generates a result based on the comparison and outputs the result from reader block 350 via outport OUT2 352b. The comparison may include comparing the value in data store 330b with the value generated by the constant generator 354 to determine whether, for example, the data store 330b value indicates that the data store has been written within a time-step of execution or other evaluation of model 300 and/or the data store has been written more than once within the time-step or other evaluation.

For example, constant generator 354 may be configured to generate a Boolean TRUE value. Note that generator 354 may be used to generate other types of values, such as integers, floating-point values, fixed-point values, or other representations. The data store 330b may be written with a Boolean TRUE value by the writer block 340 after or contemporaneous with writing a value to data store 330a. The compare logic 356 may be configured to logically AND the Boolean TRUE generated by the constant generator 354 with the Boolean TRUE read from the data store 330b to generate a Boolean TRUE signal that is output at outport OUT2 352b. The Boolean TRUE output from outport OUT2 352b may indicate, for example, that the data store 330a was written prior to being read.

Likewise, for example, the data store 330b may hold a value that represents a number of times the data store 330a has been written by writer 340 within a time-step of execution or other evaluation of model 300. The constant generator 354 may generate a value (e.g., a "1") that is compared, by compare logic 356, with the value stored in the data store 330b to determine if the data store has been written, for example, at least once but not more than once within a time-step of execution or other evaluation of model 300. If the data store has been written, the compare logic 356 may output a signal (e.g., Boolean TRUE), which indicates the condition (i.e., the logic has been written once but not more than once within the time-step or other evaluation) has been met. Otherwise, the compare logic may output a signal (e.g., Boolean FALSE), which indicates the condition has not been met. It should be noted that compare logic 356 may be configured to check for other conditions associated with the value generated by constant generator 354 and the value stored in data store 330b.

Figure 3D:
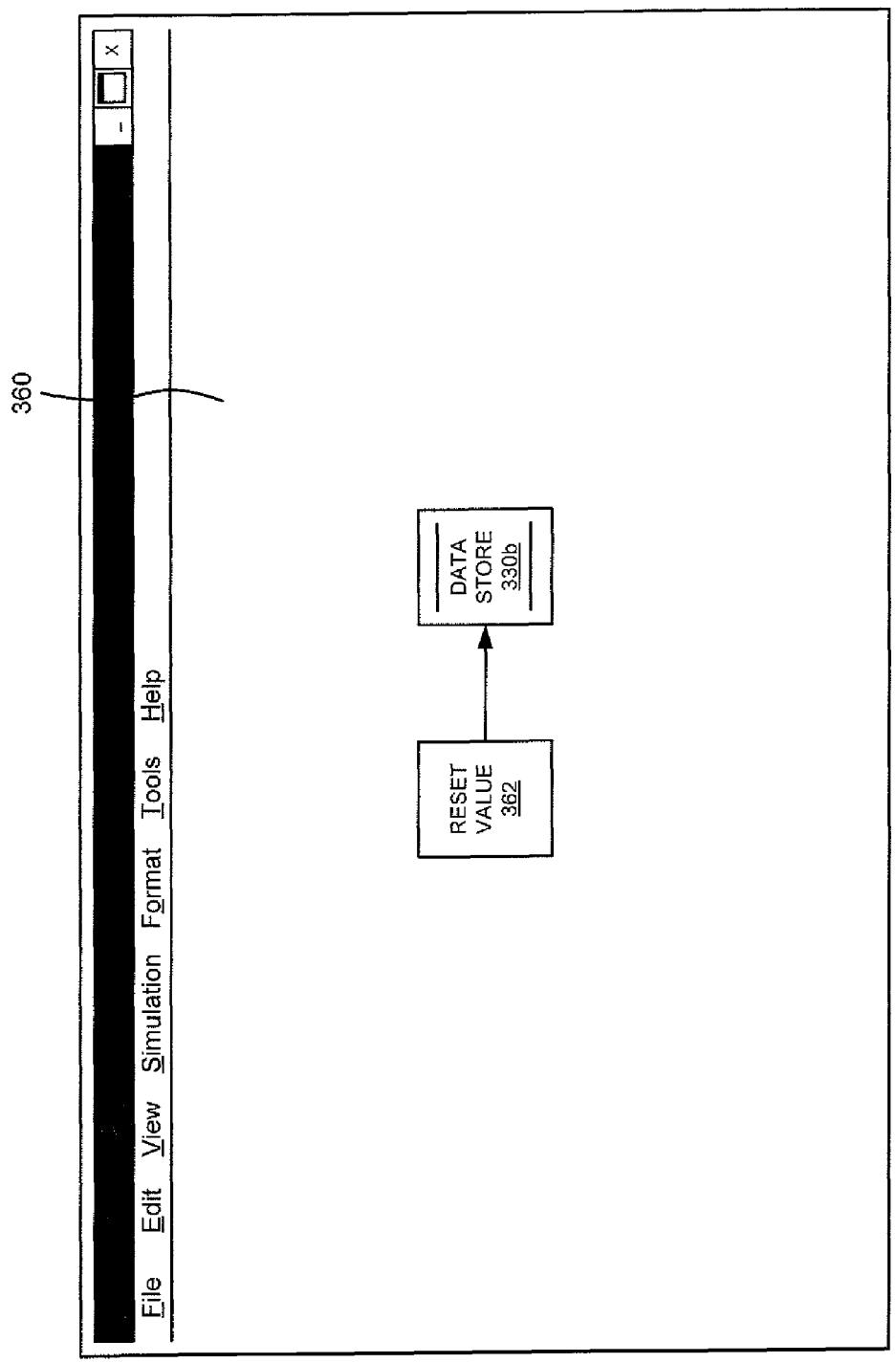

FIG. 3D illustrates example functions that may be performed by reset block 360 in more detail. Referring to FIG. 3D, reset block 360 may comprise a reset value block 362 that is configured to output a pre-defined value (e.g., zero) that is written into data store 330b and that indicates that the contents of data store 330a has not been written by the writer block 340 within a time-step of execution or other evaluation of model 300.

Note that blocks 330b, 344, 354, 356, and 360 may be added to model 300 to make the model 300 amenable to a constraint satisfaction problem (e.g., a Boolean satisfiability problem (SAT)) that may be solved by a solver, such as a satisfiability solver. For example, the satisfiability solver may be used to identify a particular pattern exists in the model with respect to accessing a data store. The pattern may include whether the data store is written prior to being read (or vice-versa), written multiple times prior to be read (or vice-versa), etc. Further, if the pattern exists in the model 300, the analysis may include identifying how and/or why the pattern exists in the model 300. It should be further noted that other blocks or functions may be added to model 300 in order to make the model 300 amenable to the above-described and/or other constraint satisfaction problems. Other approaches may involve model checking or abstract interpretation to find the pattern.

Various functions associated with the above-described blocks in model 300 may be analyzed by the analyzer component 260 to identify whether a specified pattern exists in model 300 with respect to accessing data store 330a. For example, model 300 may be analyzed by analyzer component 260 to determine whether a value associated with the data store block 330a is written by the writer block 340 prior to being read by the reader block 350 and/or whether the writer block 340 writes a value associated with the data store block 330*a* multiple times prior to the reader block 350 reading the value within a time-step of execution or other evaluation of the model 300. The analysis may be performed statically (e.g., not during the execution of the model 300) or dynamically (e.g., during the execution of the model 300). The analysis may involve, for example, analyzing an intermediate representation (IR) that is generated from model 300.

Figure 4:
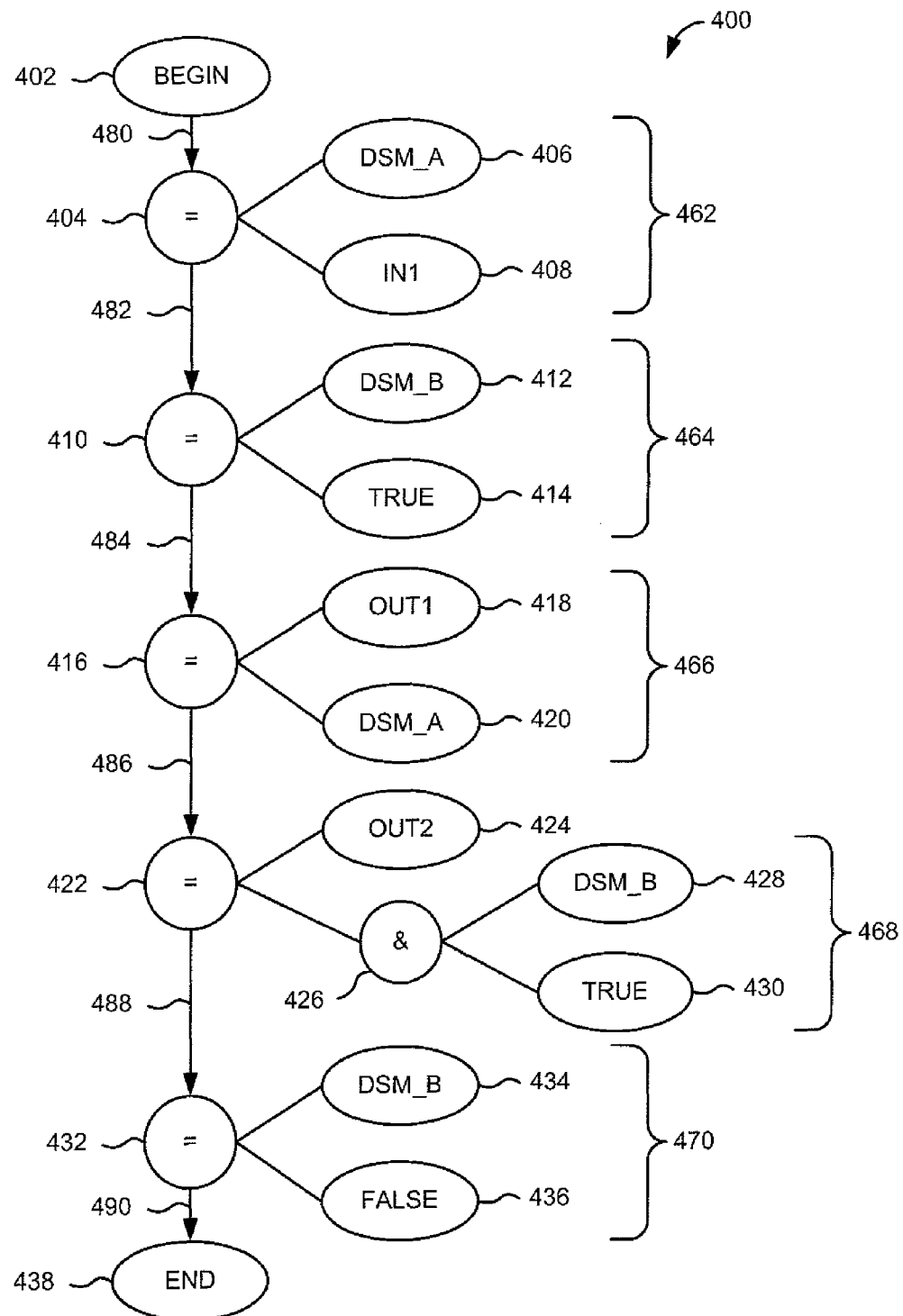
FIG. 4 illustrates an example of a intermediate representation (IR) that may be generated from a model.

FIG. 4 illustrates an example of an IR 400 that may be generated from model 300 and that may be analyzed to determine whether the model 300 contains one or more specified patterns with respect to accessing a data store, such as data store 330*a*. Referring to FIG. 4, the IR 400 may represent an execution sequence of operations 462, 464, 466, 468, and 470 that are associated with an execution of model 300. The sequence begins at node 402 and ends at node 438.

Nodes 406, 404, and 408 correspond to operation 462, which involves writing data store 330*a* (DSM_A) with a value that is present at import IN1 342 (FIG. 3B). Nodes 410, 412, and 414 correspond to operation 464, which involves writing data store 330*b* (DSM_B) with a value (i.e., Boolean TRUE) that is generated by the status update block 344. Nodes 416, 418, and 420 correspond to operation 466, which involves reading the value from data store 330*a* and outputting the value at outport OUT1 352*a* (FIG. 3C). Nodes 422, 424, 426, 428, and 430 correspond to operation 468, which involves reading the Boolean TRUE value written to data store 330*b*, comparing it to a Boolean TRUE and outputting a Boolean TRUE at outport OUT2 352*b*. Nodes 432, 434, and 426 correspond to operation 470, which involves writing data store 330*b* with a Boolean FALSE value by the reset value block 362 (FIG. 3D).

Arrows 482, 484, 486, and 488 indicate an order in which the above operations are executed. Thus, for example, arrow 482 indicates that operation 462 executes before operation 464, arrow 484 indicates operation 464 executes before operation 466, etc. The analyzer component 260 may analyze this order of operations to identify a particular specified pattern in model 300. For example, the specified pattern may be whether data store 330*a* is written before it is read. Analyzer component 260 may analyze the order of operations represented in IR 400 to identify that data store 330*a* is indeed written (operation 462) before it is read (operation 466).

A block in a block diagram may be associated with one or more attributes. The attributes may be specified, e.g., by a user. A variable, called a block parameter, may be associated with an attribute of the block. An attribute may be specified by setting its associated parameter to a corresponding value. For example, to set the foreground color of a block to red, the value of its foreground color parameter may be set to the string "RED".

One or more parameters may be associated with a model, such as model 300, that indicate whether a data store, associated with the model, may be, for example, (1) read prior to being written, or vice-versa, and/or (2) written more than once prior to being read, or vice-versa, in a time-step of execution or other evaluation of the model. For example, ME 200 may provide a GUI that may be used to display and/or set parameters associated with a block in the model.

FIG. 5 illustrates an example of a GUI 500 that may be used to display and/or set parameter information 530 that may be associated with a data store block in the model. The GUI 500 may be displayed, for example, in response to selecting the data store block (e.g., double clicking on the block 330), utilizing a menu selection from a menu associated with the menu tool bar 312, or making a gesture, for example, with a pointing device.

Referring to FIG. 5, the parameter information 530 includes a WRITE_COUNT parameter 530*a*, RESET_VALUE parameter 530*b*, READ_CONDITION parameter 530*c*, and WRITE_CONDITION parameter 530*d*. The WRITE_COUNT parameter 530*a* may be used to indicate whether the data store is written and/or a number of times the data store block is written by, e.g., a writer block within a time-step of execution or other evaluation of the model. This parameter 530*a* may be used, for example, as an alternative to data store 330*b*. Code may be provided to check the WRITE_COUNT parameter 530*a* to determine whether the data store has been written and/or a number of times the data store block has been written in a particular time-step of execution or other evaluation of the model before the data store block is read.

Alternatively, one or more parameters may be associated with the data store to specify how the WRITE_COUNT parameter 530*a* is used to identify whether the data store is written before the data store is read and/or the data store is written multiple times before the data store is read. Here, the one or more other parameters may be part of an expression (e.g., a Boolean expression), which includes the write count and which may be evaluated as part of executing a data store block associated with the data store to determine if, for example, any of the above conditions (i.e., whether the data store has been written and/or the data store has been written multiple times before the data store is read) is true. A result (e.g., a data value) may be returned that reflects the evaluation of the expression.

The RESET_VALUE parameter 530*b* may be used to indicate a reset value that the WRITE_COUNT parameter is set to, for example, at the end of a time-step of execution or other evaluation of the model. In this example, the reset value is zero. Code may be included in the model to set the value in the WRITE_COUNT parameter 530*a* to the value of the RESET_VALUE parameter 530*b* at the end of a time-step of execution or other evaluation of the model.

The READ_CONDITION parameter 530*c* and the WRITE_CONDITION parameter 430*d* may be used to specify one or more test conditions that may be performed prior to reading and writing the data store, respectively. For example, the value associated with the READ_CONDITION parameter 530*c* is an expression that indicates a condition where if the WRITE_COUNT is greater than zero, the expression evaluates to a Boolean TRUE. This expression may be used to determine whether a request to read the data store is allowed (e.g., if the expression evaluates to a Boolean TRUE, the read may be allowed).

Likewise, for example, the value associated with the WRITE_CONDITION parameter 530*d* is an expression that indicates a condition where if the WRITE_COUNT is equal to the RESET_VALUE (i.e., the data store hasn't been written), the expression evaluates to a Boolean TRUE. This expression may be used to determine whether a request to write the data store is allowed (e.g., if the expression evaluates to a Boolean TRUE, the write may be allowed).

Other parameters associated with a data store may be provided that may aid in a determination of whether the data store may be written prior to being read within a time-step of execution or other evaluation of a model. For example, parameters may be maintained for one or more blocks that indicate a time within the time-step when a data store is read and when a data store is written.

Figure 6A:
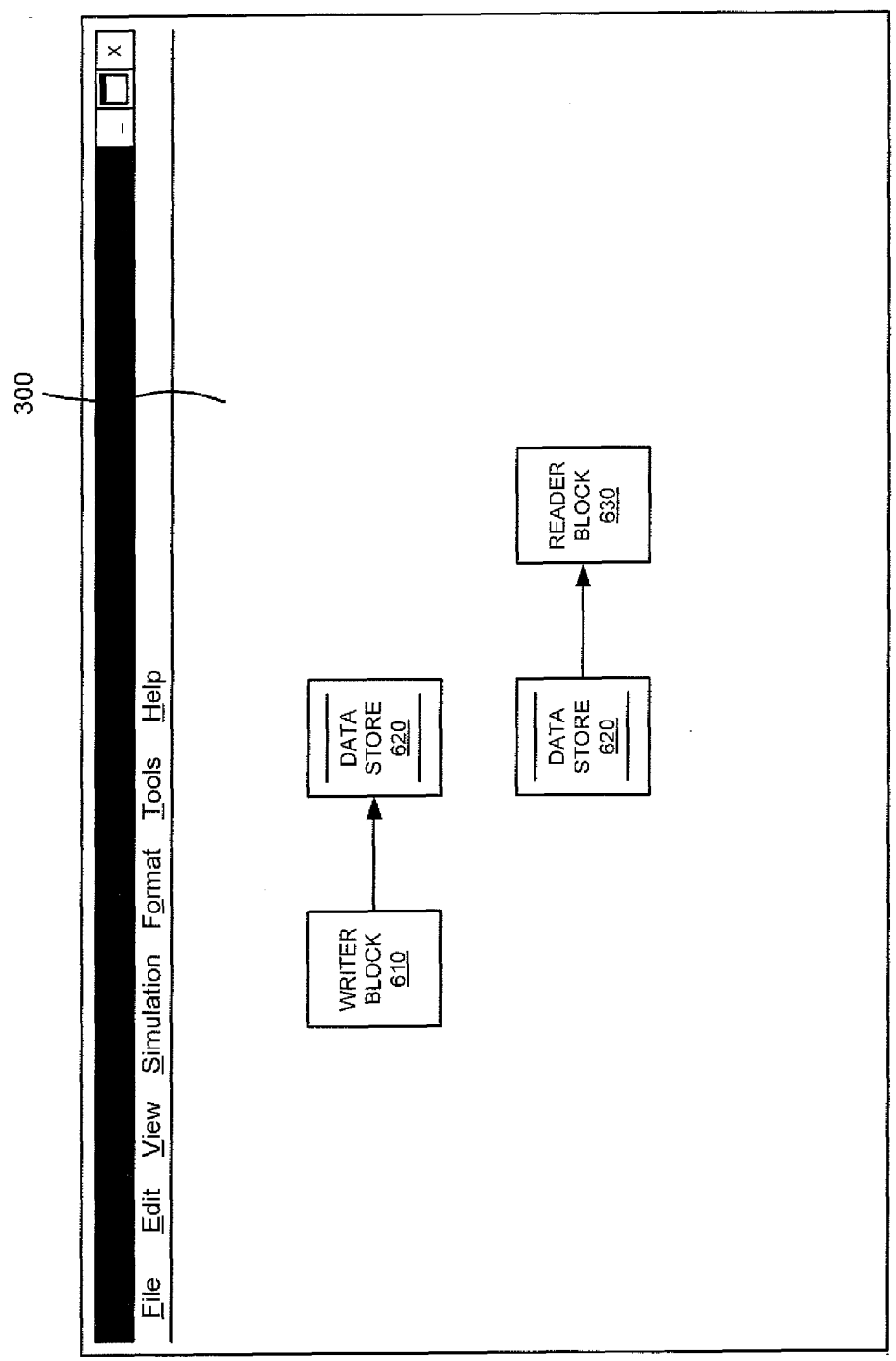
FIGS. 6A-D illustrate a block diagram of an example of a model that may read and write to a data store.

For example, FIG. 6A illustrates a block diagram of another example embodiment of model 300. The block diagram comprises a writer block 610, a data store block 620 and a reader block 630. The writer block 610 is configured to write a value into the data store block 620 and the reader block 630 is configured to read the value from the data store block 620.

Figure 6B:
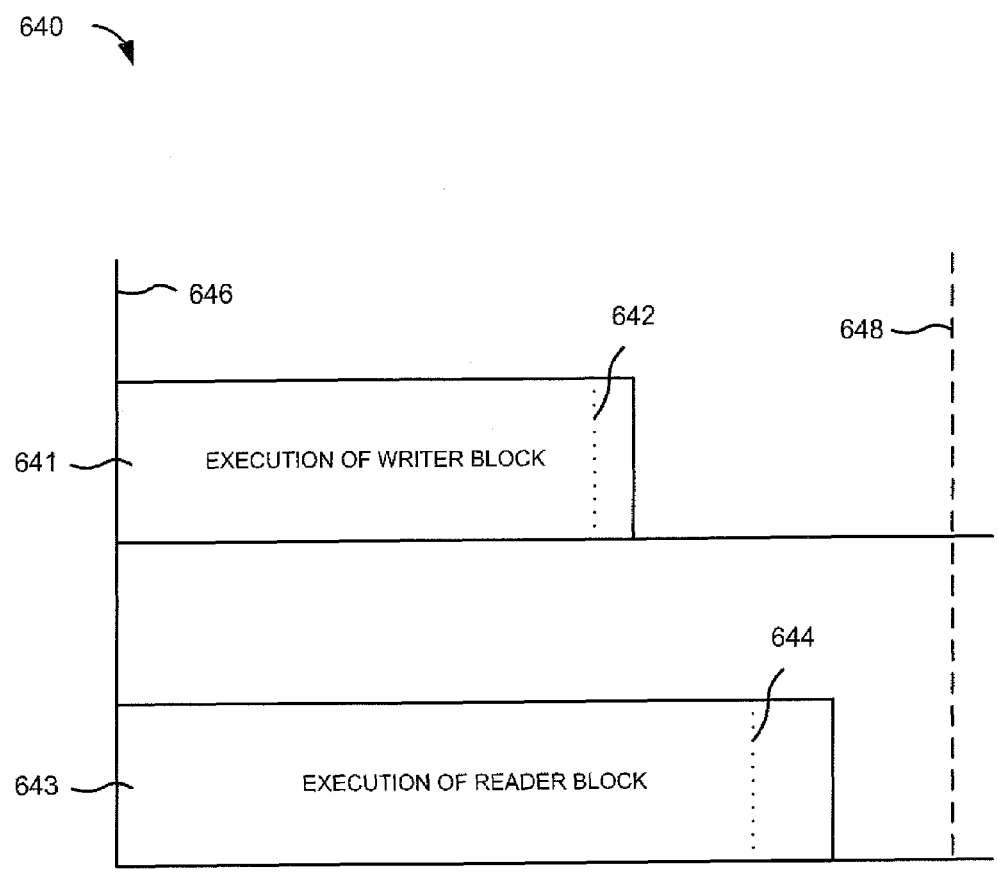

FIG. 6B illustrates a timing diagram 640 that shows an example of a multi-task time-step of execution, for model 300 illustrated in FIG. 6A, that begins at a time 646 and ends at a time 648. A first task 641 executes the writer block 610 from the beginning of the time-step 646 and writes the data store block at a time 642. Likewise, a second task 643 executes the reader block 630 from the beginning of the time-step 646 and reads the data store block at a time 644 which is later in time than time 642. As can be seen by this timing diagram, within the illustrated time-step the data store block 620 is written by the writer block 610 prior to being read by the reader block 630.

Parameters that indicate times when a data store is written and read by writers and readers to the data stores, respectively, may be helpful in identifying patterns with respect to accessing the data store. These patterns may include, for example, reading the data store before it is read, or vice-versa, and/or writing the data store multiple times before it is read, and vice-versa. The parameters may hold values that may represent actual or estimated physical times of execution (e.g., real time) that may reflect, for example, worst case times, mean times, median times, etc. The values may be determined by observation, calculation, on-target profiling, analysis of actual implementation in hardware, and so on.

Figure 6C:
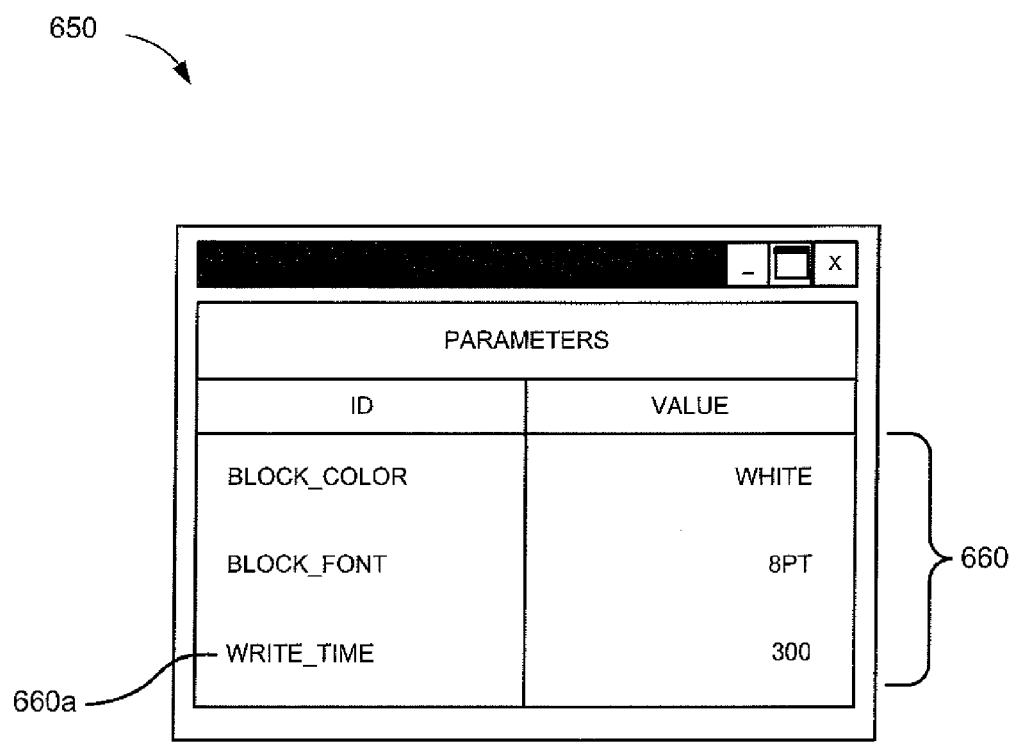

FIG. 6C illustrates an example GUI that may be used to display and/or set parameters 660 associated with a writer block, such as writer block 610. The parameters 660 include a WRITE_TIME parameter 660a, which may hold a value that represents a time when the writer block writes a value to a particular data store block within the time-step. In this example, the WRITE_TIME parameter 660a is set to a value 300.

Figure 6D:
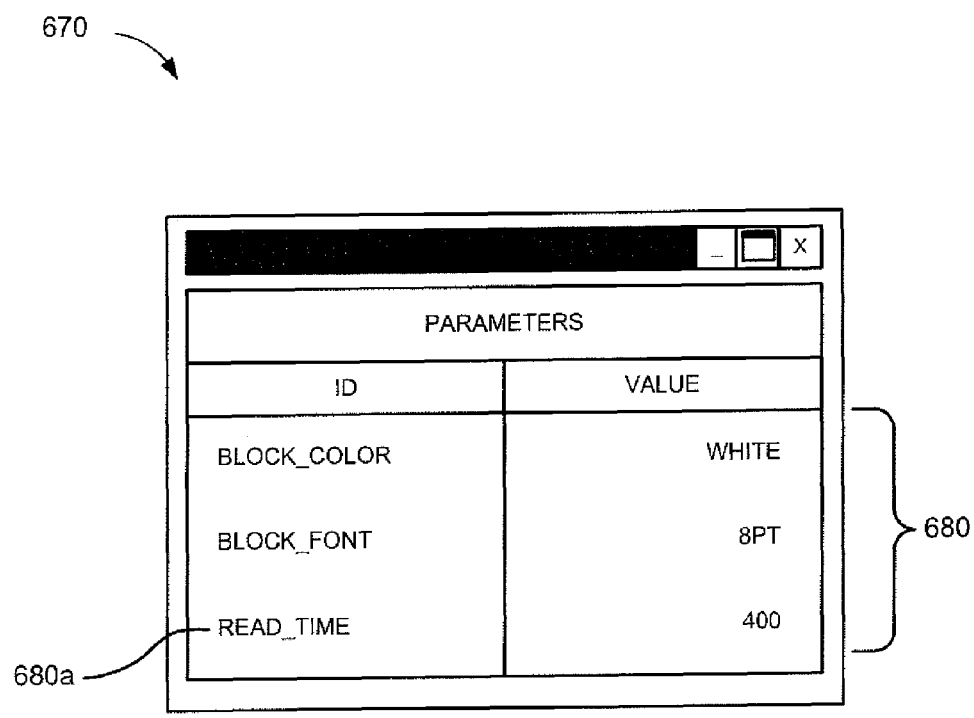

Likewise, FIG. 6D illustrates an example GUI that may be used to display and/or set parameters 680 associated with a reader block, such as read block 630. The parameters 680 include a READ_TIME parameter 680a, which may hold a value that represents a time when the reader block reads a value from the data store block within the time-step. In this example, the READ_TIME parameter 680a is set to 400, which illustratively is a time that occurs after the time indicated by the WRITE_TIME parameter 660a.

The WRITE_TIME parameter 660a and/or the READ_TIME parameter 680a may be used, for example, by analyzer component 260, when analyzing model 300 to identify one or more specified patterns in model 300. For example, a specified pattern to be identified may be that the data store is read after it is written within a time-step of execution or other evaluation of model 300. The analyzer may identify whether this pattern exists by comparing the WRITE_TIME parameter 660a with the READ_TIME parameter 680a. In this example, the pattern exists because the READ_TIME parameter 680a and WRITE_TIME parameter 660a indicate that the data store is read after it is written.

Figure 7:
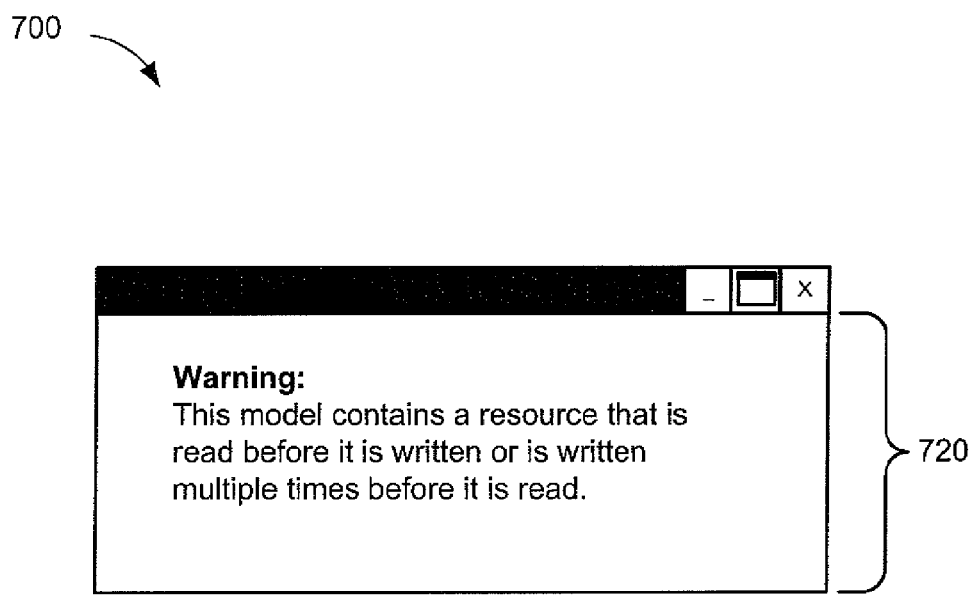
FIG. 7 illustrates an example of a GUI that may be used to report a result of an analysis of a model in accordance with an embodiment of the invention.

After a model, such as model 300, is analyzed, as described above, a result may be generated that indicates a result of the analysis. The result may be presented to a user in the form of a GUI. FIG. 7 illustrates an example of a GUI 700 that may be used to a report a result of a model analyzed in accordance with an embodiment of the invention. Referring to FIG. 7, the GUI 700 may include text 720 that indicates the result. In GUI 700, the text provides an indication that the analyzed model contains a resource that is read before it is written or is written multiple times before it is read.

It should be noted that results of the above analysis may be reported in other ways. For example, the results may be reported in the form of a return code, an event, and so on. Moreover, the results may be output in ways other than through a GUI, such as GUI 700. For example, portions of a block diagram that are associated with the pattern may be displayed differently than portions of the block diagram that are not associated with the pattern. Here, the portions associated with pattern may be highlighted, colored differently, etc. The other portions not associated with the pattern may be, for example, grayed-out, made invisible, etc.

Figure 8:
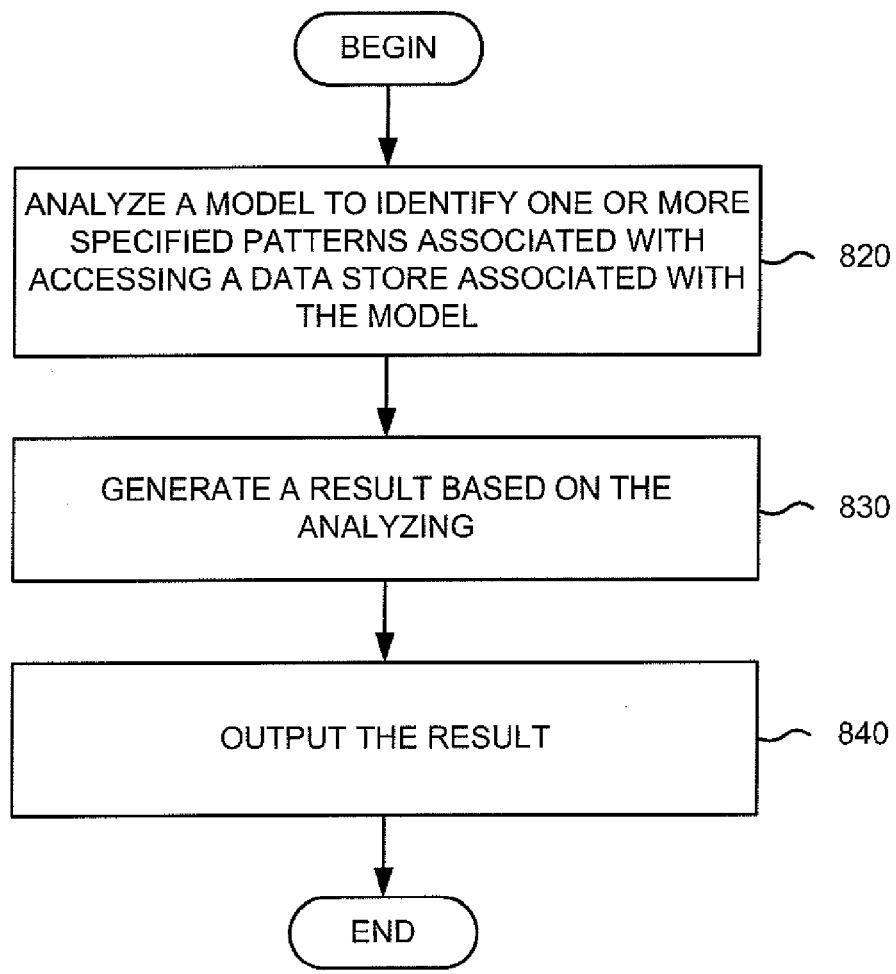
FIG. 8 illustrates a flowchart of acts that may be used to analyze a model in accordance with an embodiment of the invention.

FIG. 8 illustrates a flowchart of acts that may be used to analyze a model to identify one or more specified patterns associated with accessing a data store associated with the model, generate a result based on the analysis, and output the result. Referring to FIG. 8, at block 820, a model, such as model 300, is analyzed to identify one or more specified patterns associated with accessing a data store associated with the model. The analysis may be static and/or exhaustive. The analysis may employ approximations of functionality in the model, for example, to simplify the analysis. These approximations may include, for example, conversion of floating-point arithmetic to rational-number arithmetic, linearization (e.g., of two-dimensional lookup tables), and unrolling of while loops. The data store may or may not be included in the model. For example, the data store may be part of another model that is referenced by the model. The specified patterns may be specified, for example, by a user, a database, a file, a message, etc. The specified patterns may be desirable, anomalous, and/or undesirable read and/or write patterns associated with accessing the data store.

For example, the analysis may include analyzing write times and read times associated with writers (e.g., writer blocks) that write the data store and readers (e.g., reader blocks) that read the data store to determine whether the data store is written before the data store is read and/or the data store is written one or more times before the data store is read. Likewise, for example, the analysis may involve analyzing one or more parameters and/or one or more auxiliary data stores associated with a data store to determine whether the data store has been written before it is read and/or the data store has been written multiple times before it is read. In addition, the analysis may involve analyzing an IR of the model, for example, as described above, to determine if a specified pattern exists in the model.

At block 830, a result is generated based on the analyzing. The result may indicate (1) whether a specified pattern with respect to accessing the data store associated with the model has been identified, (2) one or more specified patterns that have been identified, etc. For example, the result may indicate whether the data store has been written by the model before the data store is read by the model and/or the data store has been written multiple times by the model before the data store is read by the model. The result that is generated may be in the form of a return code, text, graphics, and so on that indicates whether the pattern is identified, as described above. Moreover, as also described above, the result may indicate one or more portions of the model that may contribute to the specified read and/or write pattern.

At block 840, the result is outputted. The result may be outputted, for example, as a message, an event (e.g., an error or exception event is thrown), an error code, a status flag, indicator, and so on. A message indicating the result may be presented to a user in the form of a GUI, such as GUI 700, although other techniques may be used to convey the result to a user. Moreover, the result may be indicated in a graphical block diagram of the model. As noted above, portions of the graphical block diagram associated with the pattern may be displayed differently than portions of the graphical block diagram not associated with the pattern. It should be noted that modalities other than displaying or storing may be used to output the result. For example, the result may be output through the use of audio. Here, the result may be output as spoken natural language that may be synthesized In a model, a reader block may read a data store by issuing a read request to the data store. The read request may be processed by the data store. The processing may include, for example, checking whether the data store has been written and/or the data store has been written multiple times prior to the read request.

Figure 9A:
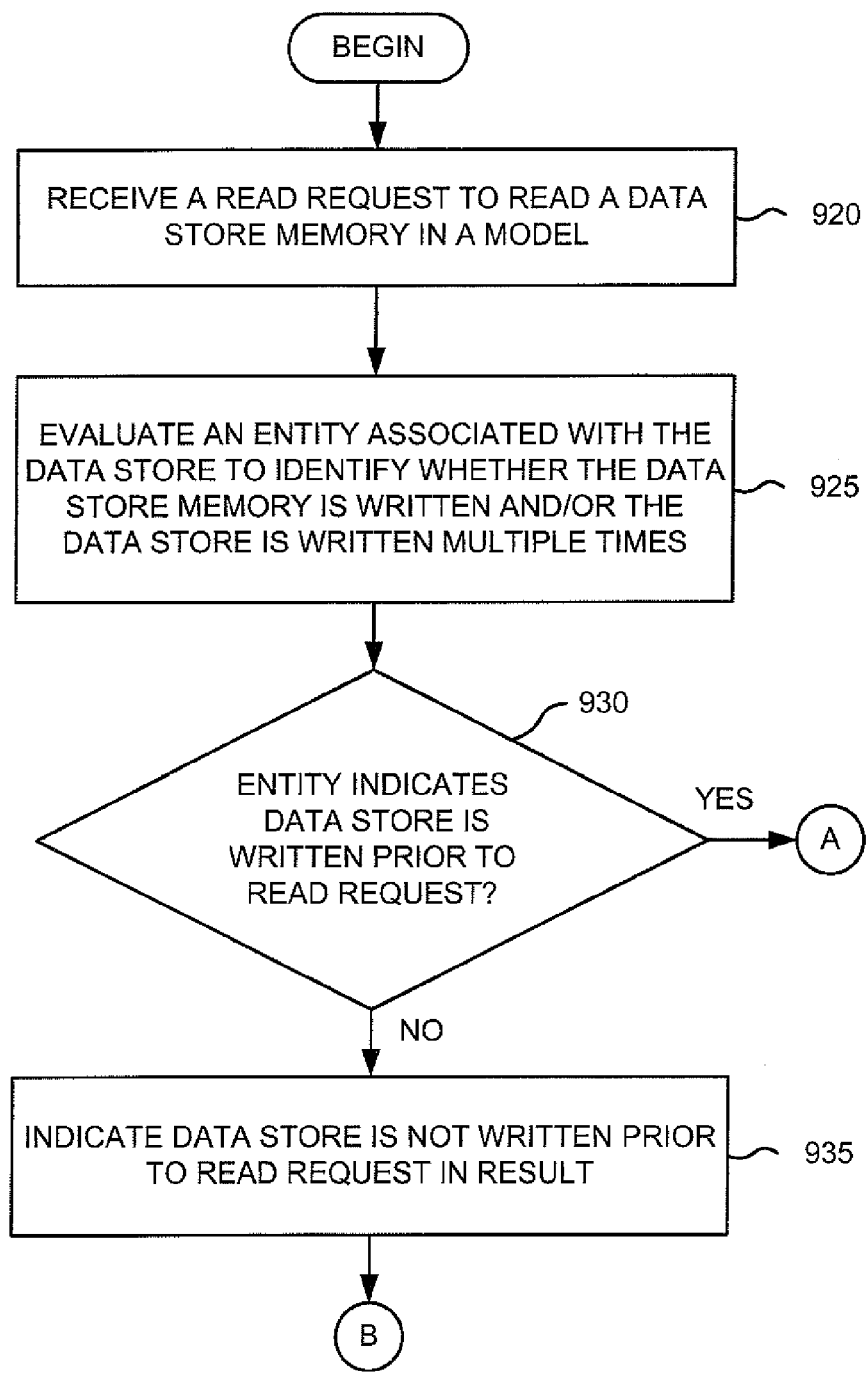
FIGS. 9A-B illustrate a flowchart of acts that may be used to process a read request in accordance with an embodiment of the invention.
Figure 9B:
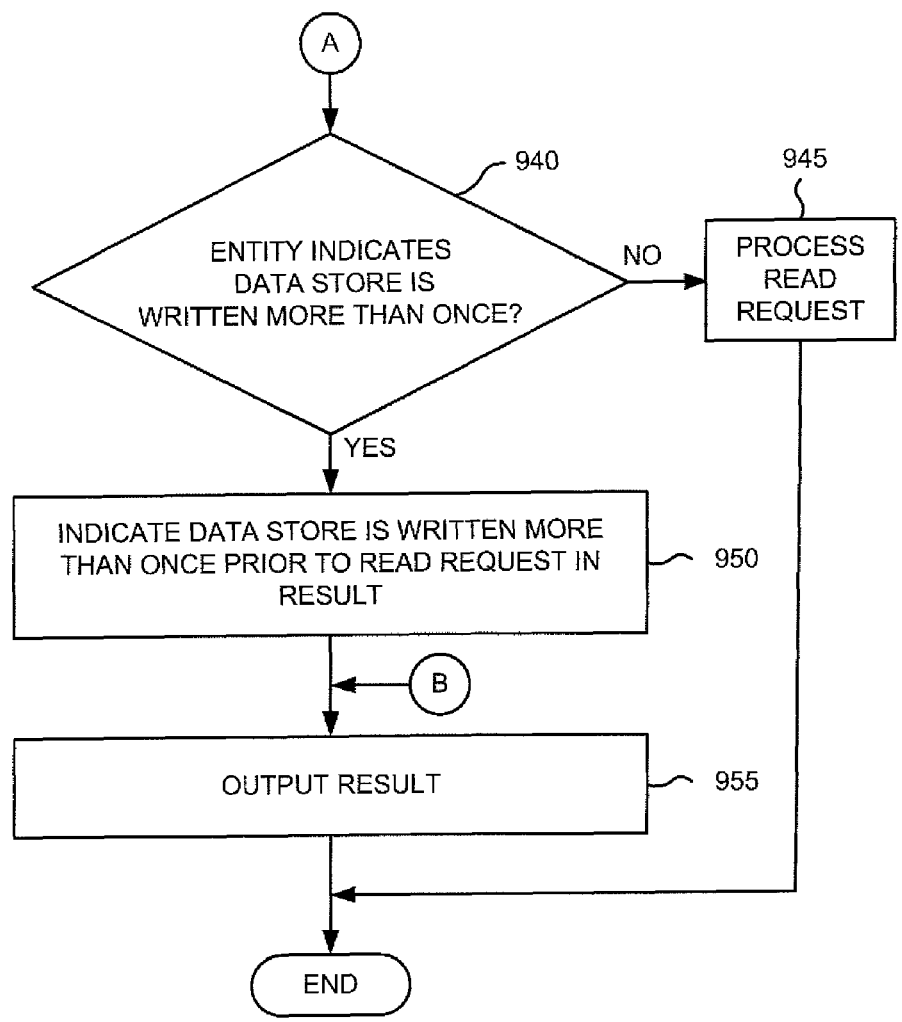

FIGS. 9A-B illustrate a flowchart of acts that may be used to process a read request, for reading data from a data store associated with a model, such as model 300, in accordance with an embodiment of the invention. Referring to FIG. 9A, at block 920, the read request is received. The read request may be received in the form of a message, token, event, signal, etc. that is passed to the data store for processing. The read request may be received during the course of a static analysis or dynamic analysis of the model. At block 925, an entity associated with the data store is evaluated to identify whether the entity indicates that the data store memory is written and/or the data store is written one or more times by the model. The entity may be, for example, one or more parameters and/or auxiliary data stores associated with the data store, etc. that may be configured to indicate whether the data store is written and/or is written multiple times. The evaluation may include examining the entity to determine whether it contains a value that indicates the data store is written prior to the read request and/or the data store is written multiple times prior to the read request.

At block 930, a check is performed to determine whether the entity indicates the data store is written. If not, at block 935, a result is generated that indicates that the data store is not written prior to the read request, for example, as described above. The result is then outputted at block 955 (FIG. 9B). As noted above, outputting the result may involve, for example, displaying a GUI that indicates the result, indicating the result on a block diagram display of the model, etc.

Otherwise, at block 930, if the entity indicates the data store is written, at block 940 (FIG. 9B), a check is performed to determine whether the entity is written more than once. If not, at block 945, the read request is processed. Otherwise, at block 950, a result is generated to indicate that the data store is written more than once prior to the read request and the result is outputted (block 955).

Note that the above may be adapted to identify other specified patterns associated with accessing the data store. For example, the above may be adapted to identify whether the data store is read multiple times before the data store is written. Here, an entity associated with the data store may maintain a count of a number of times the data store is read. The count could be tested prior to a write operation to identify a number of times that the data store is read prior to the write operation.

Figure 10A:
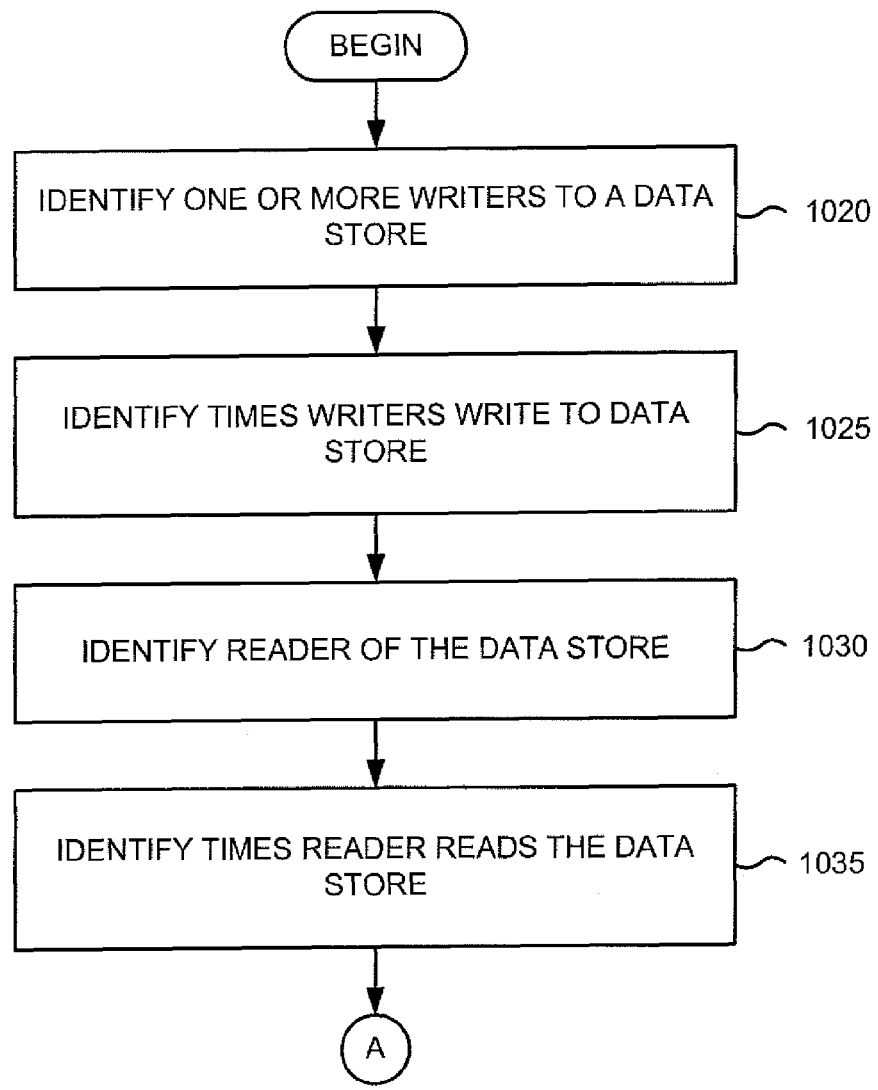
FIGS. 10A-C illustrate a flowchart of acts that may be used to analyze a model in accordance with an embodiment of the invention.
Figure 10B:
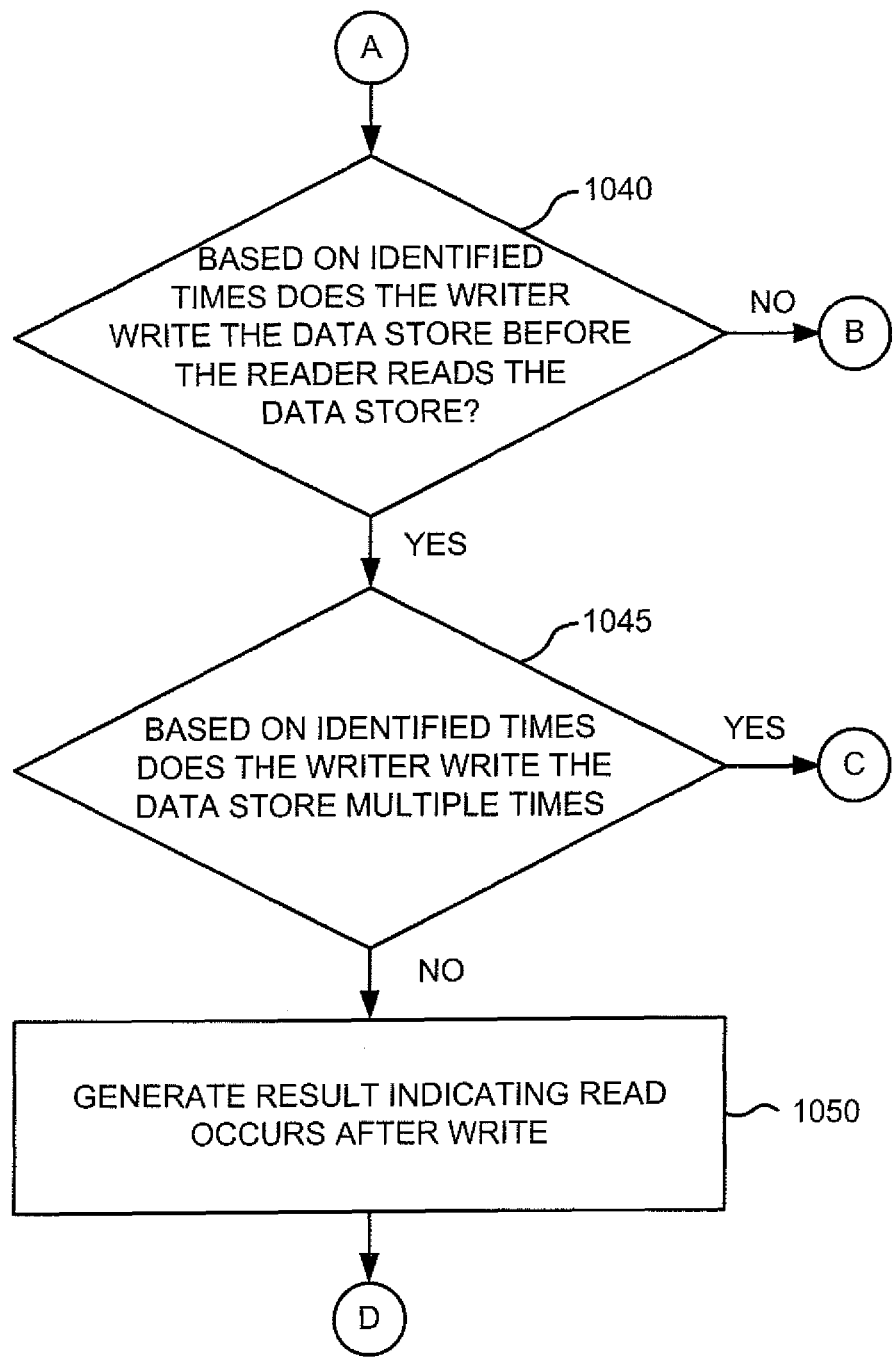
Figure 10C:
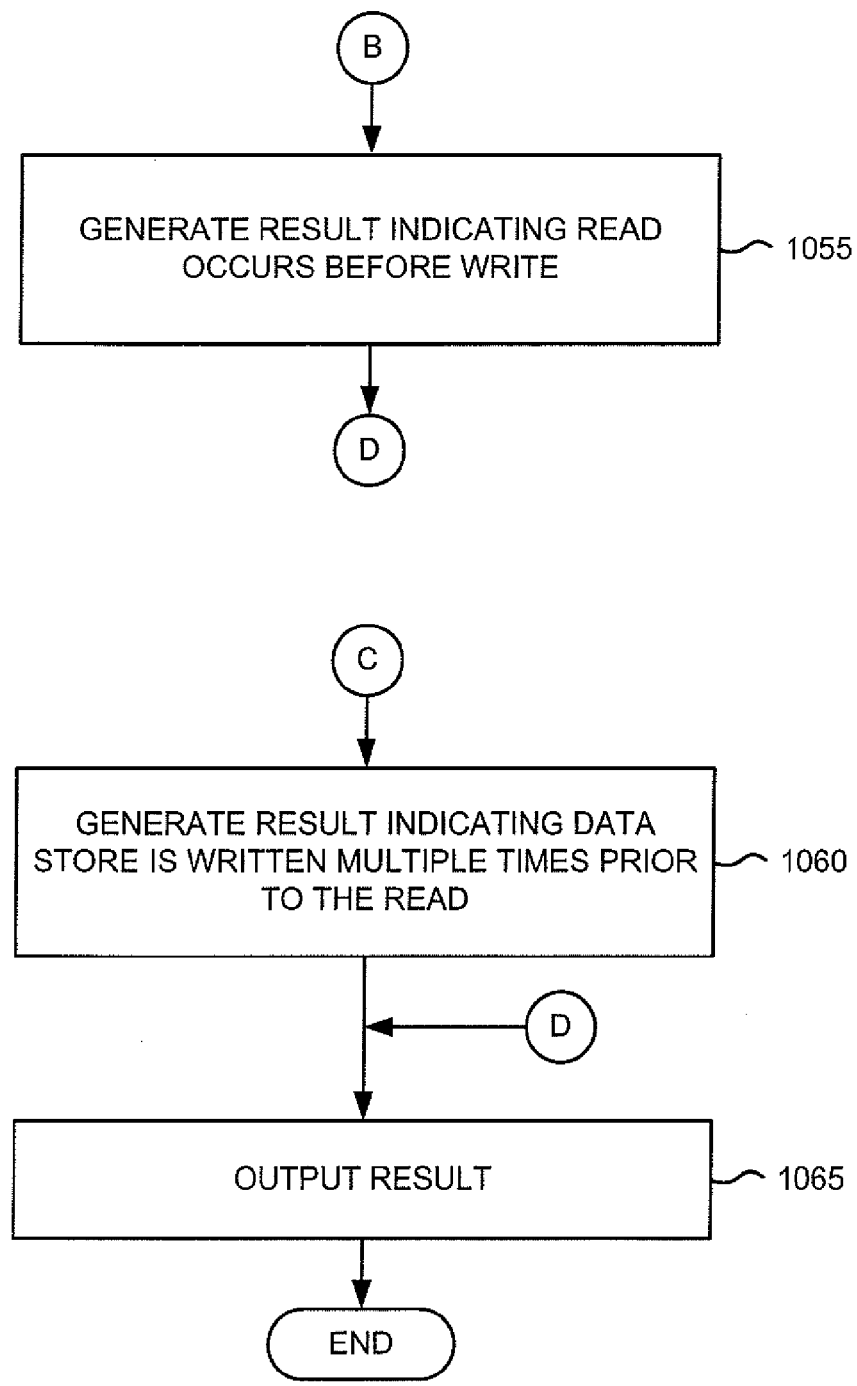

FIGS. 10A-C illustrate a flowchart of acts that may be used to analyze a model in accordance with an embodiment of the invention to identify one or more specified patterns associated with accessing a data store such as whether the model writes to the data store before the model reads the data store and/or the model writes to the data store multiple times before the model reads the data store.

Referring to FIG. 10A, at block 1020, one or more writers that write to the data store are identified. The writers may include one or more writer blocks contained in the model. At block 1025, one or more times that the writers write to the data store (write times) are identified. The write times may be indicated in one or more parameters associated with the writers where the parameters indicate the times that the writers write to the data store, such as described above. For example, a parameter may include a table or a list that indicates one or more times that a writer writes to the data store, or time can be computed from an implementation model. An implementation model may be a model that captures implementation information. This information may be for example, block execution time, etc.

At block 1030, a reader that reads the data store is identified. The reader may be a reader block contained in the model. At block 1035, one or more times that the reader reads the data store (read times) are identified. Likewise, the read times may be indicated by one or more parameters associated with the reader, such as described above.

At block 1040 (FIG. 10B), the identified write times and read times are compared to determine if they indicate whether the writer writes the data store prior to the reader reading the data store. If not, at block 1055 (FIG. 10C) a result is generated that indicates that the read occurs before the data store has been written. At block 1065, the generated result is outputted.

At block 1040, if the identified write times and read times indicate that the data store is written prior to the reader reading the data store, at block 1045, a check is performed to determine whether the identified write times and read times indicate the data store is written multiple times before it is read. If so, at block 1060, a result is generated that indicates that the data store is written multiple times prior to being read. At block 1065, the result is outputted.

Otherwise, if at block 1045, the identified times indicate that the data store has not been written multiple times prior to the read, at block 1050, a result is generated that indicates the read occurs after the data store is written and before the data store is written multiple times. The result is outputted at block 1065. The above results may be generated and outputted, as described above.

It should be noted that the above acts may be adapted to check for other specified patterns associated with accessing the data store. For example, the above acts may be adapted to determine whether, based on the identified times, the reader reads the data store before the writer writes the data store and/or the reader reads the data store multiple times before the writer writes the data store. If so, appropriate results may be generated that indicate these patterns and the results may be output, as described above.

Figure 11:
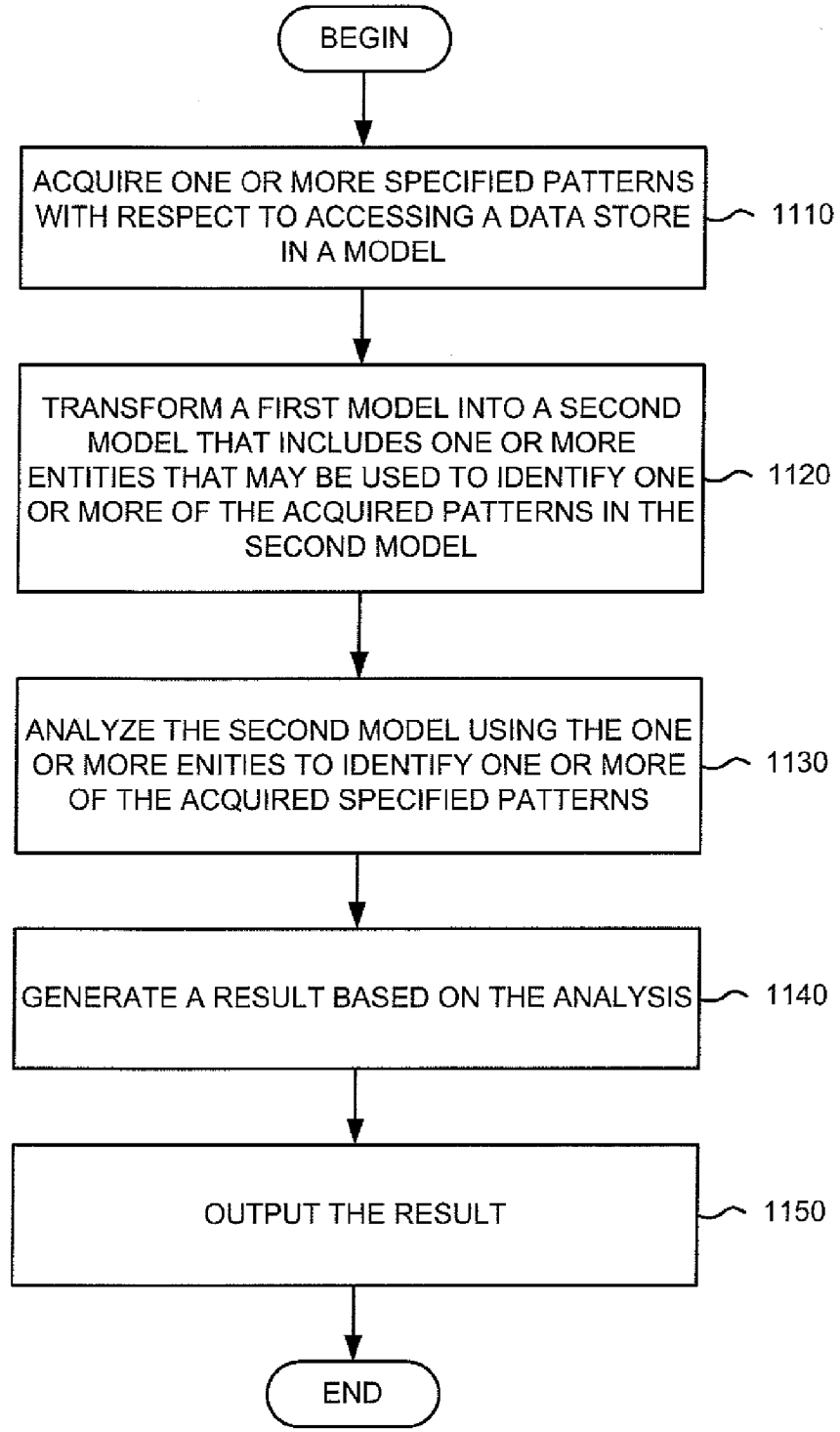
FIG. 11 illustrates a flowchart of acts that may be used to transform a model to include entities that may be used to identify one or more specified patterns.

FIG. 11 illustrates a flowchart of acts that may be used to (1) transform a model, such as model 300, to include one or more entities that may be used to identify one or more specified patterns in the model with respect to accessing a data store associated with the model and (2) analyze the transformed model using the entities to identify the one or more specified patterns, in accordance with an embodiment of the invention. Note the transformed model may or may not be visible to the user. For example, the transformed model may be in a form that may be stored in storage and may be readily processed by a computer system but may not be readily made visible to a user.

Referring to FIG. 11, at block 1110, one or more specified patterns with respect to accessing a data store in the model are acquired. The specified patterns may be specified, for example, by a user, in a database, in a file, in a message, etc. The specified patterns may be acquired by reading input supplied by the user, reading the database containing the specified patterns, reading the file containing the specified patterns, receiving the message containing the specified patterns, and so on. At block 1120, a first model is transformed into a second model that includes one or more entities that may be used to identify one or more specified patterns in the first model with respect to accessing a data store associated with the model. The entities may be, for example, one or more parameters, such as parameters described above, code, blocks, etc. that may be used to accommodate the identification of the one or more write patterns. The entities may be added during, for example, compilation of the first model, generation of the first model, an analysis of the first model, etc.

For example, the first model may include a data store, such as data store 330a. The first model may be compiled into a second model that includes, for example, the data store, an auxiliary data store, such as data store 330b, and reset logic, such as reset logic 360. Likewise, for example, a user may specify a data store for the first model, and the ME 200 may automatically generate the auxiliary data store and reset logic in response to the user specifying the data store. Moreover, the first model may be built and subsequently analyzed wherein the analysis includes automatically adding the auxiliary data store and the reset logic.

At block 1130, the second model is analyzed to identify one or more specified patterns with respect to accessing the data store. As noted above the specified patterns may be desirable, anomalous, and/or undesirable read and/or write patterns. The analysis may include analyzing the entities, such as described above, to determine if they indicate one or more specified patterns. For example, the entities may include parameters, such as the read times and write times parameters described above, and these parameters may be analyzed to determine if a one or more read operations occur in the second model before a write operation and/or vice-versa.

At block 1140, a result is generated based on the analysis. The result may indicate whether one or more specified patterns have been identified in the second model. As noted above, the result that is generated may be in the form of a return code, text, graphics, and so on. Moreover, the result may indicate one or more portions of the model that may contribute to the identified specified pattern.

At block 1150, the result is outputted. The result may be outputted in the form of message that is generated from the result, an event (e.g., an error or exception event is thrown), an error code, a status flag, and so on. A message indicating the result may be contained in a GUI, such as GUI 700. Moreover, outputting the result may include highlighting, coloring, etc. blocks in a block diagram of the second model that contribute to the identified specified pattern, as described above. In addition, the result can be in the form of a counter example that evidences specific behavior that is counter to what is correct and/or desirable.

Figure 12:
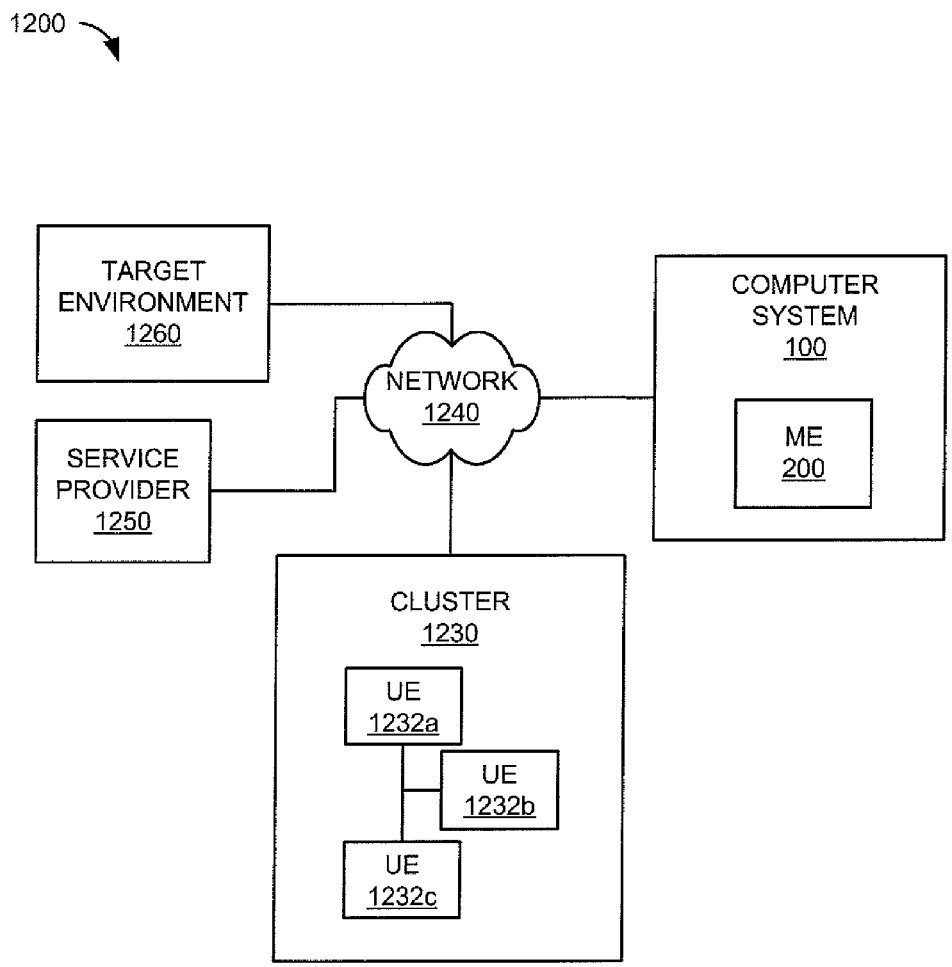
FIG. 12 illustrates an example of a distributed environment that may be configured to practice one or more embodiments of the invention.

FIG. 12 illustrates an example of a distributed environment 1200 that may be configured to practice one or more embodiments of the invention. Referring to FIG. 12, the distributed environment 1200 may comprise one or more entities, such as, a network 1240, a service provider 1250, a target environment 1260, a cluster 1230, and a computer system 100.

The network 1240 may be a communications network that is capable of exchanging information (e.g., data) between entities associated with the network 1240, such as, for example, the computer system 100, the service provider 1250, the target environment 1260, and the cluster 1230. The exchanged information may be encapsulated (e.g., in a packet) or unencapsulated. Implementations of the network 1240 may include local area networks (LANs), metropolitan area networks (MANs), wide-area networks (WANs), etc. Information may be exchanged between entities using one or more network protocols, which may include, but are not limited to, the Internet Protocol (IP), the User Datagram Protocol (UDP), the Transport Control Protocol (TCP), the Asynchronous Transfer Mode (ATM) protocol, the Synchronous Optical Network (SONET) protocol, the Ethernet protocol, etc.

The network 1240 may comprise various network devices, such as routers, switches, firewalls, servers, etc. Portions of the network 1240 may be wired (e.g., using wired conductors, optical fibers, etc.) and/or wireless (e.g., using free-space optical (FSO), radio frequency (RF), acoustic transmission paths, etc.). Portions of the network 1240 may include a substantially open public network, such as the Internet. Portions of the network 1240 may include a more restricted network, such as a virtual private network (VPN), etc. It should be noted that implementations of networks and/or devices operating on networks described herein are not limited with regards to information carried by the networks, protocols used in the networks, the architecture/configuration of the networks, etc.

The service provider 1250 may include logic (e.g., hardware, software, etc.) that makes a service available to another device in the distributed environment 1200. The service provider 1250 may include a server operated by an entity (e.g., an individual, a corporation, an educational institution, a government agency, etc.) that provides one or more services to a destination, such as computer system 100. The services may include software containing computer-executable instructions that may be executed, in whole or in part, by a destination, by the service provider 1250 on behalf of the destination, or some combination thereof. The services may be configured to process computer programs in whole or in part on behalf of another entity in the network 1240. The computer programs may contain data and/or computer-executable instructions that are configured to implement aspects of the invention.

The target environment 1260 may include logic configured to provide an environment for executing computer programs that may be generated and/or processed by entities contained in the distributed environment 1200. These computer programs may include executable software (e.g., an executable model) that is configured to execute on the target environment 1260. Examples of the target environment 1260 may include, but are not limited to, embedded systems, in-circuit emulators (ICEs), personal computers, multiprocessor systems, multi-core systems, heterogeneous computation systems, FPGAs, ASICs, ASIPs, DSPs, PLDs, MEMS, CPLDs, etc.

The cluster 1230 may include one or more units of execution (UEs) 1232 that may perform processing on behalf of the computer system 100 and/or another entity, such as service provider 1250. For example, in an embodiment the cluster 1230 may parallel process one or more computer programs that contain one or more class definitions that include one or more enumerations. The UEs 1232 may reside on a single device or chip or on multiple devices or chips. For example, the UEs 1232 may be implemented in a single ASIC or in multiple ASICs. Likewise, the UEs 1232 may be implemented in a single computer system or multiple computer systems. Other examples of UEs 1232 may include FPGAs, CPLDs, ASIPs, microprocessors, etc.

It should be noted that one or more embodiments of the invention may be applied to models that are associated with one or more statecharts. FIGS. 13A-D illustrate a block diagram of an example embodiment of model 300 that includes a statechart block that represents a statechart. The example model 300 may be analyzed for one or more specified patterns with respect to accessing a data store associated with the model 300 in accordance with one or more embodiments of the invention.

It should be noted that model 300 illustrated in FIGS. 13A-D is just one example of a model associated with a statechart that may be analyzed, in accordance with one or more embodiments of the invention, to identify one or more specified patterns with respect to accessing a data store associated with the model. Other models associated with one or more statecharts that are more complex or less complex than the model 300 illustrated in FIGS. 13A-D may be analyzed, in accordance with one or more embodiments of the invention, to identify one or more specified patterns with respect to accessing a data store associated with the model.

Figure 13A:
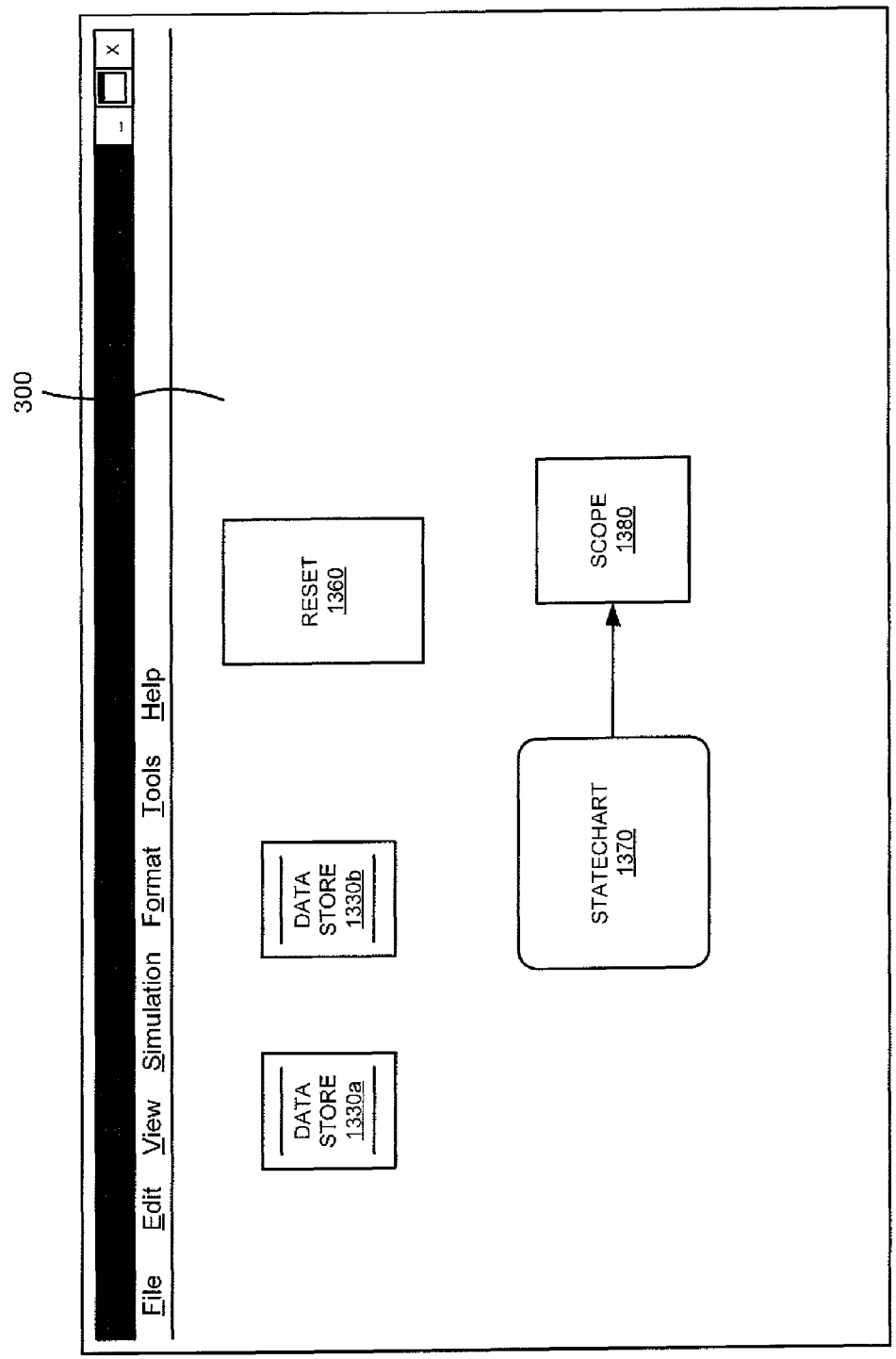
FIGS. 13A-D illustrate a block diagram of an example of a model that includes a statechart.

Referring to FIG. 13A, model 300 comprises data store blocks 1330a-b, reset block 1360, a statechart block 1370, and a scope block 1380. Data store blocks 1330a-b and reset block 1360 are similar to data store blocks 330a-b and reset block 360, described above. The scope block 1380 provides a display for information that is output by the statechart block 1370.

Figure 13B:
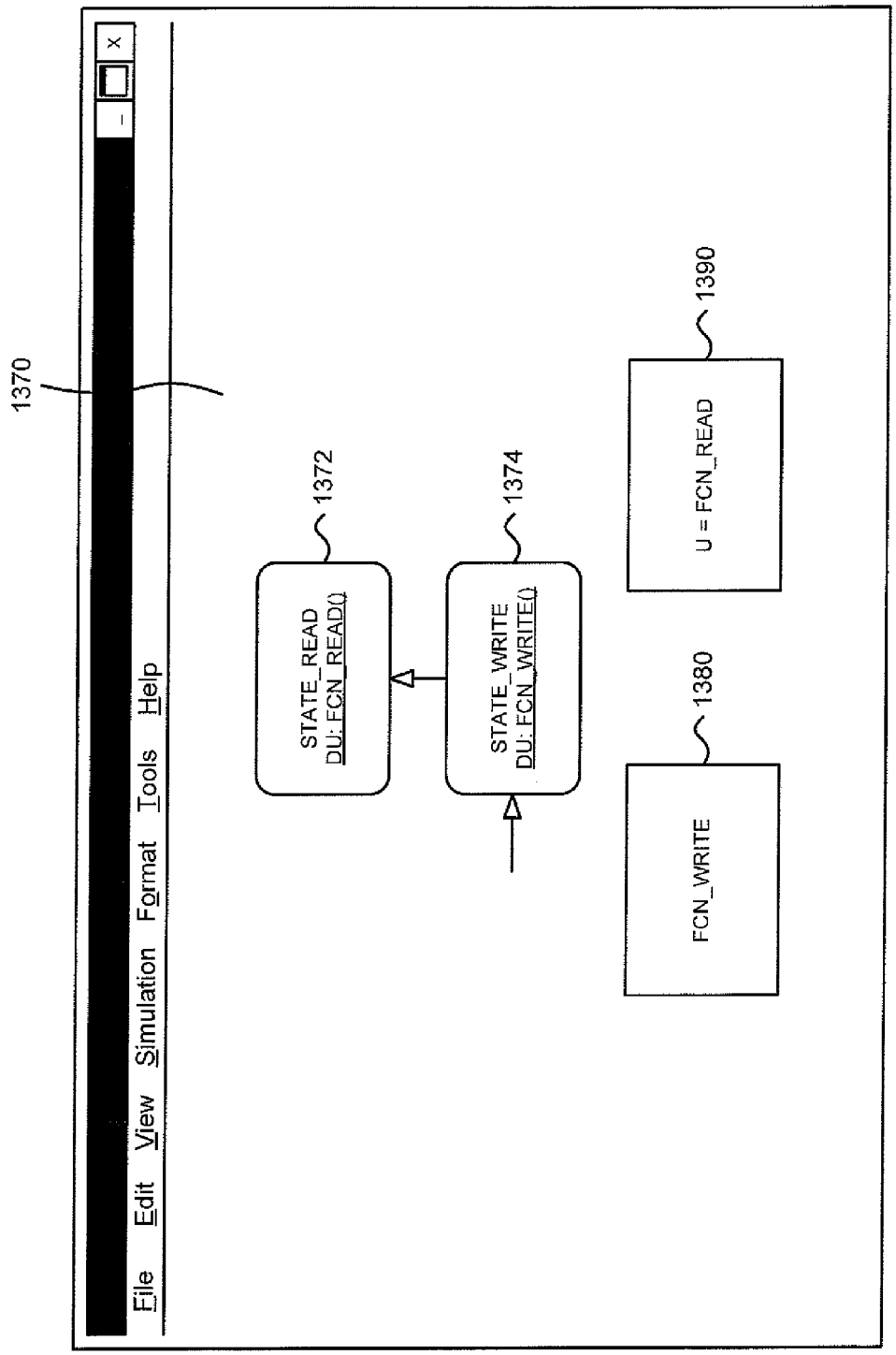
Figure 13C:
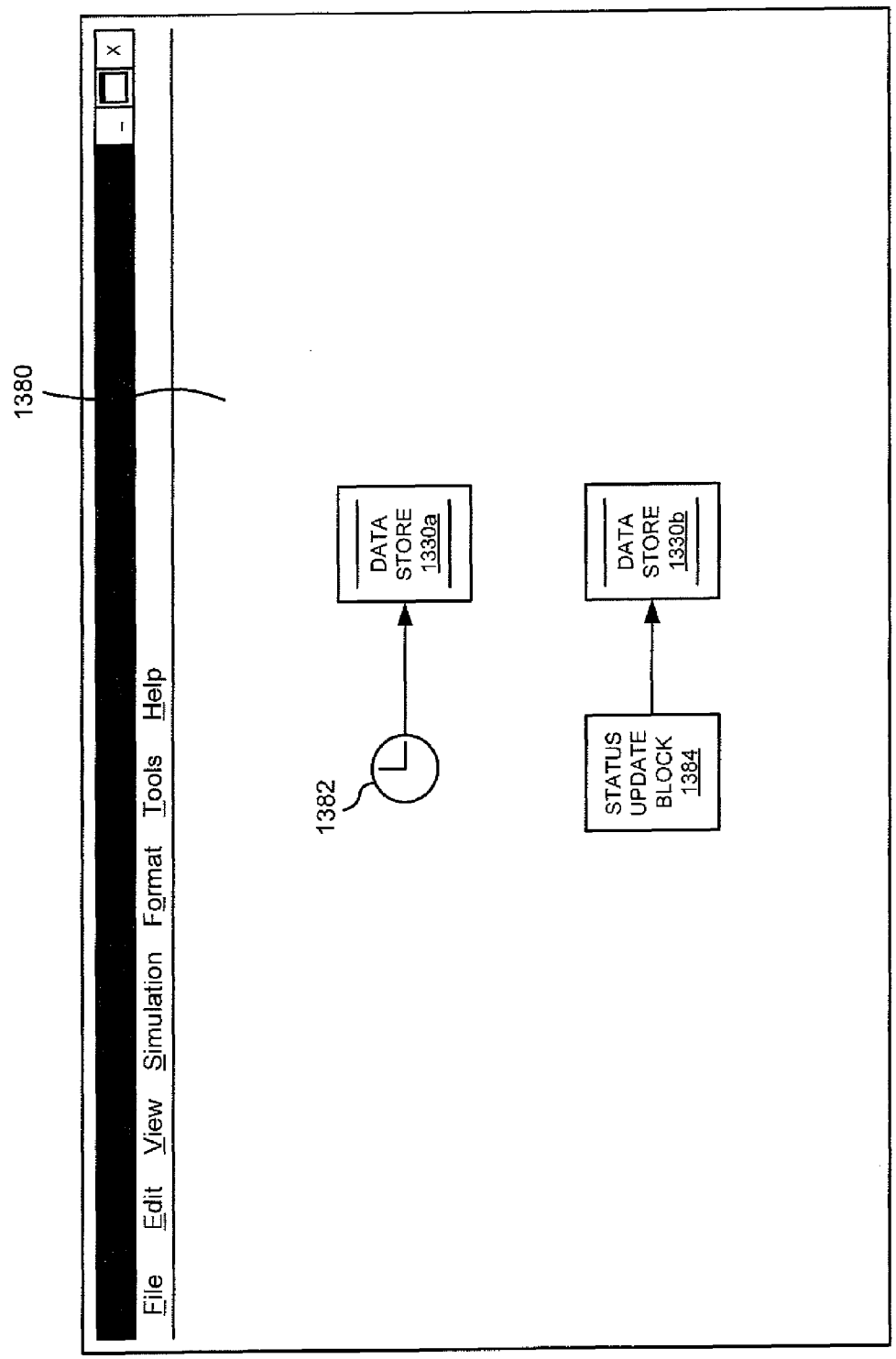
Figure 13D:
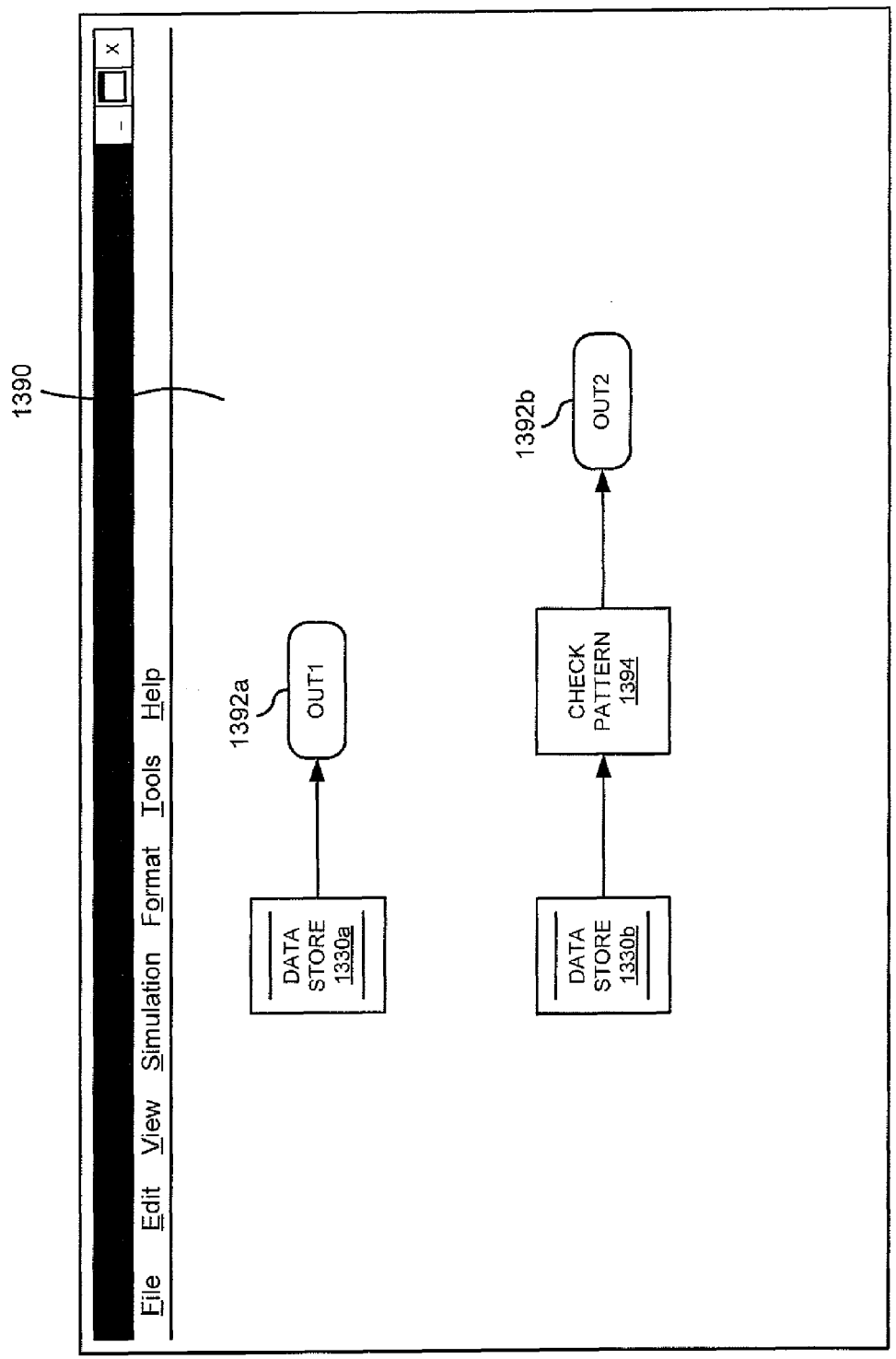

FIG. 13B illustrates the statechart block 1370 in more detail. Referring to FIG. 13B, statechart block 1370 includes a read state (STATE_READ) 1372, a write state (STATE_WRITE) 1374, a write function (FCN_WRITE) 1380, and a read function (FCN_READ) 1390. FIG. 13C illustrates the write function 1380 in more detail. Referring to FIG. 13C, write function 1380 includes a clock 1382, data store blocks 1330a-b, and status block 1384. Clock 1382 may be a clock that may be configured to generate a current logical time. Status update block 1384 is similar to status update block 344 described above. FIG. 13D illustrates read function 1390 in more detail. Referring to FIG. 13D, read function 1390 includes data stores 1330a-b, outports 1392a-b, and check pattern block 1394. Outports 1392a-b are similar to outports 352a-b, described above. Check pattern block 1394 uses data store 1330b to check for a specified pattern with respect to accessing data store 1330a (e.g., whether data store 1330a has been written prior to being read, whether data store 1330a has been written multiple times prior to being read, etc.).

Operationally, statechart 1370 enters the write state 1374. In the write state 1374, FCN_WRITE 1380 is called to write a value into data store 1330a. The value that is written into 1330a may be the current logical time by clock 1382. In response to FCN_WRITE 1380 being called, status update block 1384 generates a value that is written into data store 1330b.

On return from FCN_WRITE 1380, statechart block 1370 transitions to read state 1372. In the read state 1372, FCN_READ 1390 is called to read the value written into data store 1330a. Specifically, the value is read from data store 1330a and output from FCN_READ 1390 at outport 1392a. In addition, the value in data store 1330b is read and input into check pattern 1394 which checks the value to determine whether a specified pattern exists with respect to accessing data store 1330a. A result of the check is generated by block 1394 and is output at outport 1392b. The result may be used to determine whether the specified pattern exists in the embodiment of model 300, illustrated in FIGS. 13A-D.

Note that in the above example, the read state 1372 is entered prior to the write state 1374. Thus, in the above example, data store 1330a is written prior to being read. Assuming that check pattern block 1394 is configured to find a pattern where data store 1330a is read before it is written, the result that is at outport 1392b would indicate that this pattern does not exist in the embodiment of model 300 illustrated in FIGS. 13A-D and the value output a outport 1392a may be considered valid. However, if, for example, the statechart 1370 was designed to first enter the read state 1372 prior to the write state 1374, the result that is output at outport 1392b would indicate that the pattern exists in the embodiment of model 300 illustrated in FIGS. 13A-D. In this situation, any value that may be output from outport 1392a may be considered invalid or undefined.

It should be noted that one or more embodiments of the invention may be applied to transactional memories. A transactional memory is a memory that may involve multiple reads and/or writes in a single transaction. The above-described techniques may be adapted to determine, for example, whether data stores involved in a single transaction are written prior to being read. Moreover, the transaction may be further analyzed to identify whether the transaction may attempt to read or write a data store while it is being read or written by another transaction. This analysis may involve analysis across data stores. Further, the analysis may involve identifying whether a data store is accessed by a transaction while it is also accessed by another transaction.

It should be further noted that embodiments of the invention may be applied to analyzing, for example, concurrent state diagrams, software component diagrams, hardware description logic (HDL) designs, state flow models, data flow models, and so on. Moreover, models that may be analyzed using embodiments of the invention may include function call subsystems.

The foregoing description of embodiments is intended to provide illustration and description, but is not intended to be exhaustive or to limit the invention to the precise form disclosed. Modifications and variations are possible in light of the above teachings or may be acquired from practice of the invention. For example, while a series of acts has been described with regards to FIGS. 8, 9A-B, 10A-C, and 11 the order of the acts may be modified in other implementations. Further, non-dependent acts may be performed in parallel.

Also, the term "user", as used herein, is intended to be broadly interpreted to include, for example, a computer system (e.g., a workstation) or a user of a computer system, unless otherwise stated.

It will be apparent that embodiments, described herein, may be implemented in many different forms of software and/or hardware in the implementations illustrated in the figures. Software code and/or specialized hardware used to implement embodiments described herein is not limiting of the invention. Thus, the operation and behavior of the embodiments were described without reference to the specific software code and/or specialized hardware—it being understood that one would be able to design software and/or hardware to implement the embodiments based on the description herein.

Portions of the invention may be implemented as "logic" that performs one or more functions. This logic may include hardware, such as an ASIC or an FPGA, software, or a combination of hardware and software. The logic may be encoded in one or more executable media and may include instructions for execution by processing logic, such as processing logic 120.

It should be noted that one or more computer-readable media may store computer-executable instructions that when executed by processing logic, such as processing logic 120, may perform various acts associated with one or more embodiments of the invention. The computer-readable media may be volatile or non-volatile and may include, for example, flash memories, removable disks, non-removable disks, and so on.

It should be further noted that various electromagnetic signals, such as wireless signals, electrical signals carried over a wire, optical signals carried over optical fiber, etc., may be encoded to carry computer-executable instructions, configured to implement one or more embodiments of the invention, on a network, such as, for example, network 1240.

No element, act, or instruction used herein should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. One or more non-transitory computer-readable storage media storing instructions, the instructions comprising:
   one or more instructions, executable by at least one processor, to:
      receive information related to a condition associated with a model accessing a data store during an execution of the model,
         the model, when executed, simulating a behavior of a system;
      analyze, when the model accesses the data store, the model;
      determine, based on analyzing the model, whether the condition associated with the model accessing the data store is satisfied; and
      generate a result,
         the result indicating whether the condition is satisfied.

2. The one or more non-transitory computer-readable media of claim 1, where the one or more instructions to determine whether the condition associated with the model is satisfied include:
   one or more instructions, executable by the at least one processor, to:
      determine whether the model accesses the data store to perform a first operation prior to accessing the data store to perform a second operation, and
      determine whether the condition associated with the model accessing the data store is satisfied based on whether the model accesses the data store to perform the first operation prior to accessing the data store to perform the second operation.

3. The one or more non-transitory computer-readable media of claim 2, where the one or more instructions to determine whether the condition associated with the model is satisfied further include:
   one or more instructions to determine that the condition is satisfied when the model accesses the data store to perform the first operation prior to accessing the data store to perform the second operation.

4. The one or more computer-readable media of claim 1, where the one or more instructions to determine whether the condition associated with the model is satisfied include:
   one or more instructions, executable by the at least one processor, to:
      determine a quantity of times the model accesses the data store to perform a particular type of operation;
      determine a pattern associated with the model accessing the data store to perform the particular type of operation the quantity of times;
      determine whether the pattern associated with the model accessing the data store to perform the particular type of operation the quantity of times corresponds to a particular pattern; and
      determine whether the condition is satisfied based on:
         the quantity of times the model accesses the data store, and
         determining whether the pattern associated with the model accessing the data store to perform the particular type of operation the quantity of times corresponds to the particular pattern.

5. The one or more computer-readable media of claim 1, where the one or more instructions to determine whether the condition associated with the model is satisfied include:
   one or more instructions, executable by the at least one processor, to:
      determine whether, during the execution of the model, the model accessing the data store corresponds to a particular pattern of a plurality of patterns; and
      determine that the condition is satisfied when the model accessing the data store corresponds to the particular pattern.

6. The one or more computer-readable media of claim 1, where the one or more instructions to determine whether the condition associated with the model is satisfied include:
   one or more instructions, executable by the at least one processor to:
      determine whether the model accesses the data store to one of:
         perform a write operation prior to accessing the data store to perform a read operation,
         read first data prior to accessing the data store to write second data, or
         perform a nominal write operation prior to accessing the data store to perform a conditional write operation; and
      determine that the condition is satisfied when one of:
         the model accesses the data store to perform the write operation prior to accessing the data store to perform the read operation,
         the model accesses the data store to read the first data prior to accessing the data store to write the second data, or
         the model accesses the data store to perform the nominal write operation prior to accessing the data store to perform the conditional write operation.

7. The one or more computer-readable storage media of claim 1, where the one or more instructions to determine whether the condition associated with the model is satisfied include:
   one or more instructions, executable by the at least one processor to:
      determine a quantity of times that the model accesses the data store to write first data to the data store prior to the model accessing the data store to read second data from the data store, and
      determine whether the condition is satisfied based on the quantity of times that the model accesses the data store to write the first data to the data store prior to the model accessing the data store to read the second data from the data store.

8. A device comprising:
   one or more processors to:
      receive information related to a condition associated with a model accessing a data store during an execution of the model,
         the model, when executed, simulating a behavior of a system,
      analyze, when the model accesses the data store, the model during the execution of the model, determine, based on analyzing the model, whether the condition associated with the model accessing the data store is satisfied, and generate a result, the result indicating whether the condition is satisfied.

9. The device of claim 8, where, when analyzing the model, the processor is further to:

determine whether the model accesses the data store to perform a first operation prior to accessing the data store to perform a second operation.

10. The device of claim 9, where, when determining whether the condition is satisfied, the processor is further to:

determine that the condition is satisfied when the model accesses the data store to perform the first operation prior to accessing the data store to perform the second operation.

11. The device of claim 8, where, when analyzing the model, the processor is further to:

determine a quantity of times the data store is accessed to perform a particular type of operation, and where, when determining whether the condition is satisfied, the processor is further to:

determine whether the condition is satisfied based on the quantity of times the data store is accessed to perform the particular type of operation.

12. The device of claim 8, where, when analyzing the model, the processor is further to:

determine a pattern associated with the data store being accessed to perform one or more operations, and where, when determining whether the condition is satisfied, the processor is further to:

determine whether the pattern corresponds to a particular pattern associated with the data store being accessed to perform the one or more operations.

13. The device of claim 8, where, when determining whether the condition is satisfied, the processor is further to:

determine whether the model accesses the data store to one of:

perform a write operation prior to accessing the data store to perform a read operation, read first data prior to accessing the data store to write second data, or perform a nominal write operation prior to accessing the data store to perform a conditional write operation, and determine that the condition is satisfied when one of:

the model accesses the data store to perform the write operation prior to accessing the data store to perform the read operation, the model accesses the data store to read the first data prior to accessing the data store to write the second data, or the model accesses the data store to perform the nominal write operation prior to accessing the data store to perform the conditional write operation.

14. The device of claim 8, where, when analyzing the model, the processor is further to:

determine a quantity of times that the model accesses the data store to write first data to the data store prior to the model accessing the data store to read second data from the data store, and where, when determining whether the condition is satisfied, the processor is further to:

determine whether the condition is satisfied based on the quantity of times that the model accesses the data store to write the first data to the data store prior to the model accessing the data store to read the second data from the data store.

15. A method comprising:

receiving information identifying one or more conditions associated with a model accessing a data store during an execution of the model, receiving the information identifying the one or more conditions being performed by a device;

analyzing, when the model accesses the data store during the execution of the model, the model to determine whether the one or more conditions associated with the model accessing the data store are satisfied, analyzing the model being performed by the device;

generating a result based on analyzing the model, the result indicating whether the one or more conditions are satisfied, and generating the result being performed by the device.

16. The method of claim 15, where analyzing the model includes:

determining whether the model accesses the data store to perform a first operation prior to accessing the data store to perform a second operation.

17. The method of claim 16, where analyzing the model further includes:

determining that the condition is satisfied when the model accesses the data store to perform the second operation prior to accessing the data store to perform the first operation.

18. The method of claim 15, where analyzing the model includes:

determining that the model accesses the data store to perform a particular type of operation a particular quantity of times; and determining that the condition is satisfied when the model accesses the data store to perform the particular type of operation the particular quantity of times.

19. The method of claim 15, where analyzing the model includes:

determining, during the execution of the model, a pattern associated with the model accessing the data store; and determining whether the determined pattern corresponds to a particular pattern associated with the model accessing the data store.

20. The method of claim 15, where analyzing the model includes:

determining that the condition is satisfied when, during the execution of the model, the model accesses the data store to one of:

perform a write operation prior to accessing the data store to perform a read operation, read first data prior to accessing the data store to write second data, or perform a nominal write operation prior to accessing the data store to perform a conditional write operation, and determining that the condition is satisfied when one of:

the model accesses the data store to perform the write operation prior to accessing the data store to perform the read operation, the model accesses the data store to read the first data prior to accessing the data store to write the second data, or the model accesses the data store to perform the nominal write operation prior to accessing the data store to perform the conditional write operation.

* * * * *